(12) United States Patent
Hirama

(10) Patent No.: US 7,893,784 B2
(45) Date of Patent: Feb. 22, 2011

(54) COMPOSITE RESONANCE CIRCUIT AND OSCILLATION CIRCUIT USING THE CIRCUIT

(76) Inventor: Koichi Hirama, 19-23-306, Yaezaki-cho, Hiratsuka-shi, Kanagawa 254-0811 (JP)

( * ) Notice: Subject to any disclaimer, the term of this patent is extended or adjusted under 35 U.S.C. 154(b) by 757 days.

(21) Appl. No.: 11/666,205

(22) PCT Filed: Oct. 21, 2005

(86) PCT No.: PCT/JP2005/019832

§ 371 (c)(1),
(2), (4) Date: Nov. 16, 2007

(87) PCT Pub. No.: WO2006/046672

PCT Pub. Date: May 4, 2006

(65) Prior Publication Data

US 2008/0136542 A1    Jun. 12, 2008

(30) Foreign Application Priority Data

Oct. 26, 2004   (JP) .............................. 2004-341217
Feb. 10, 2005   (JP) .............................. 2005-034533

(51) Int. Cl.
H03B 5/30 (2006.01)

(52) U.S. Cl. ................... 331/163; 331/162; 331/116 R; 331/116 M; 331/177 R; 331/155

(58) Field of Classification Search .................... 331/37, 331/40, 116 R, 116 FE, 116 M, 154, 155, 331/162, 163, 177 R
See application file for complete search history.

(56) References Cited

U.S. PATENT DOCUMENTS 3,462,703 A  *  8/1969  Seidel .......................... 331/37

FOREIGN PATENT DOCUMENTS

| JP | 52-15943 | 2/1977 |
|---|---|---|
| JP | 52-15943 | 5/1977 |
| JP | 58-205309 | 11/1983 |
| JP | 1-221003 | 9/1989 |
| JP | 5-11518 | 1/1993 |
| JP | 5-11518 | 2/1993 |
| JP | 9-153740 | 6/1997 |
| JP | 2000-315914 | 11/2000 |
| JP | 2001-237670 | 8/2001 |

OTHER PUBLICATIONS

International Search Report dated Apr. 25, 2007.

* cited by examiner

Primary Examiner—Robert Pascal
Assistant Examiner—Ryan Johnson
(74) Attorney, Agent, or Firm—McGinn IP Law Group, PLLC

(57) ABSTRACT

There is provided a resonance circuit using piezoelectric vibrator such as a quartz resonator, a coil, a capacitor, or an element equivalent to them in combination. When two resonance circuits having different resonance frequencies are combined, it is possible to configure an oscillation circuit and a filter capable of freely adjusting the frequency characteristic by utilizing the phenomenon that by changing the excitation current or voltage of the respective resonance circuits independently from each other, antiresonance frequency of the entire composite resonance circuit can be changed.

28 Claims, 24 Drawing Sheets

FIG.19A
PRIOR ART
FIG.19B
PRIOR ART
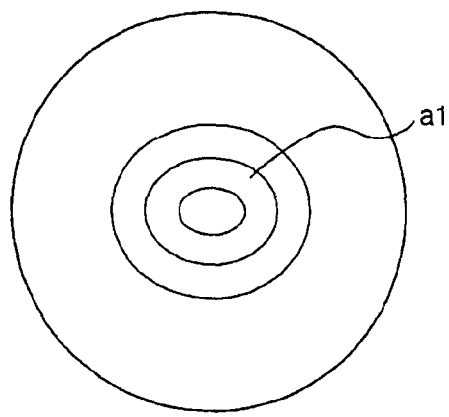
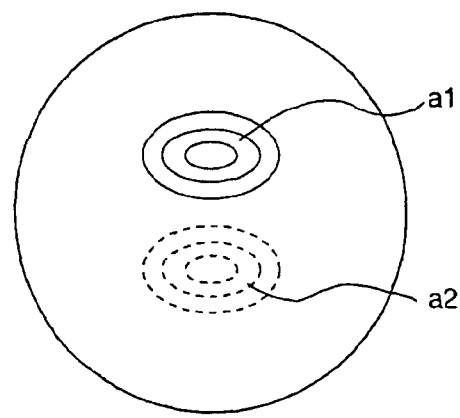
FIG. 20
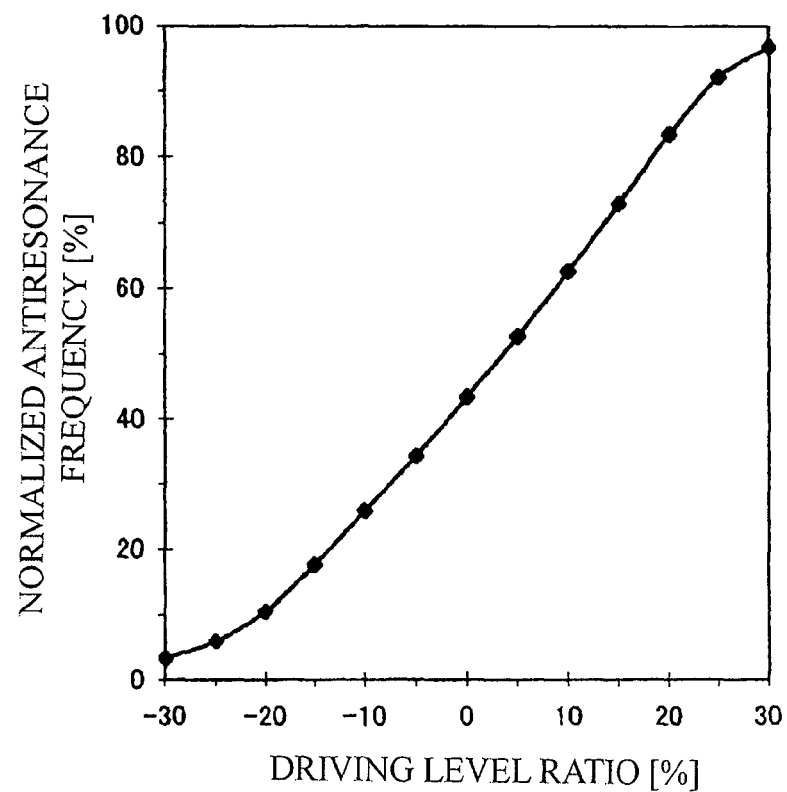

COMPOSITE RESONANCE CIRCUIT AND OSCILLATION CIRCUIT USING THE CIRCUIT

TECHNICAL FIELD

The present invention relates to a complex resonance circuit including a piezoelectric vibrator such as a quartz resonator, a coil, a capacitor, and an element equivalent to them. The present invention also relates to an oscillation circuit and a filter using the complex resonance circuit.

BACKGROUND ART

A resonance circuit including a coil, a capacitor, and a circuit element equivalent to them is used in various electronic circuits. The resonance circuit is often required to have a resonance frequency controlling function. A resonance frequency of the resonance circuit is typically controlled by changing either one or both of an inductance value of the coil and a capacity (capacitance) value of the capacitor. As one of many important electric circuits utilizing a resonance behavior of the resonance circuit, an oscillation circuit and a filter have been known. The oscillation circuit and the filter are electronic parts indispensable for operating, for example, a portable telephone and various communication apparatuses. In addition, the oscillation circuit and the filter are often required to have an oscillation frequency controlling function and a frequency characteristic (a passband frequency characteristic and a stopband frequency characteristic), respectively.

The oscillation circuit and the filter are typically provided with a piezoelectric vibrator. This is because fluctuations in a resonance vibration frequency of the piezoelectric vibrator due to aging and ambient temperature variation are relatively small in comparison with other electronic parts. In addition, the piezoelectric vibrator exhibits a excellent short-term stability of the frequency, so that the piezoelectric vibrator is indispensable for operating the oscillation circuit and using electronic devices. A piezoelectric property of a piezoelectric material and a resonance frequency characteristic of the piezoelectric vibrator are extremely useful for the filter too.

A voltage-controlled piezoelectric oscillation circuit is largely employed as a TCXO (temperature compensated crystal oscillator) for controlling a reference frequency of a portable telephone and a timing-recovering element of a digital circuit. The voltage-controlled piezoelectric oscillation circuit typically has a frequency controlling function. A frequency of the voltage-controlled piezoelectric oscillation circuit is typically controlled by a variable-reactance element such as a variable-capacitance diode.

Operation frequencies of a typical piezoelectric vibrator vary in a range from several kHz up to several tenth GHz, and thus the piezoelectric vibrator generates a signal whose frequency is adjusted over such the wide range. Depending on the frequency, vibrational motions of the piezoelectric vibrator are referred to as, for example, a tuning fork vibration, a bending vibration, a longitudinal (extensional) vibration, a face shear vibration, a thickness shear vibration, surface wave vibrations, including a face shear, a coupling mode vibration, and a Stoneley surface wave.

Recently, piezoelectric resonators referred to as a SMR (Solid Mount Resonator) and a FBAR (Film Bulk Acoustic Resonator) are proposed. A piezoelectric device (see, for example, "Technical Handbook of Surface Acoustic Wave Device" edited by the 150th Committee on Technology of Surface Acoustic Wave Device of Japan Society for the Promotion of Science, published by Ohmsha, Ltd., 1991 and "Technical Handbook of Surface Acoustic Wave Device" edited by the 150th Committee on Technology of Surface Acoustic Wave Device of Japan Society for the Promotion of Science, published by Ohmsha, Ltd., 2004) utilizing a MEMS (Micro Electro Mechanical System) technology is also proposed. A new type resonator having interleaved electrodes so as to excite Lamb waves of a high frequency (see, for example, Japanese Patent No. 3400165) is also proposed.

However, low electric power consumption and miniaturization of the oscillation circuit are prevented by the variable-capacitance diode for controlling a frequency thereof.

For the sake of expanding a variable-frequency range of the oscillation circuit, it is required to increase a variation width of the capacitance value of the variable-capacitance diode. However, the variation width of the variable-capacitance diode depends on a variation width of an applied voltage thereon, thus it is necessary to increase the applied voltage. A requirement for expanding the variable-frequency range conflicts to a requirement for decreasing the applied voltage of the oscillation circuit. Therefore, both of lowering a power supply voltage effective for low power consumption and an IC integration for miniaturization are not compossible.

For the purpose of decreasing power supply voltage, a super-cascade type variable-capacitance diode having a large variation width of a capacitance value is used as the variable-capacity diode. In a present production-line, the variable-capacitance diode of this type together with other circuit parts can not be integrated into an IC device for the sake of miniaturization. Therefore, there is no other choice to product an oscillation circuit by assembling the variable-capacitance diode as an individual circuit part.

Moreover, a mean of precisely controlling a frequency over the wide rage is useful in not only an oscillation circuit but also a filter and various resonance circuits. A new frequency controlling mean replaced by variable-capacitance diode is demanded.

The present invention is directed to solving the problems described above and provides a resonance circuit that can eliminate a variable-reactance element and a variable-inductance element, both of which are utilized in a typical resonance circuit, and also can control an oscillation frequency of a piezoelectric resonator and a frequency characteristic of a filter. The present invention also provides an oscillation circuit and a filter using the resonance circuit. The present invention also provides a complex resonance circuit including a piezoelectric vibrator whose frequency can be adjusted over a wide rage beyond a limitation of a variable-frequency width. The variable-frequency is dependent upon vibrational motion of the piezoelectric vibrator.

SUMMARY OF THE INVENTION

According to a first aspect of the present invention, there is provided a complex resonance circuit comprising at least two resonance elements having different resonance frequencies and an electric power supply circuit for supplying an electric power to the resonance elements at a variable division ratio. The electric power supply circuit includes two electric power supplying paths respectively connected to the two resonance elements and two variable attenuators or two variable gain amplifiers, each of which is inserted into each of said electric power supplying paths.

According to a second aspect of the present invention, there is provided a piezoelectric vibration device comprising single piezoelectric substrate, at least three electrode pairs formed on said substrate, and two external connection terminals pairs. The three electrode pairs are connected to the two pairs of external connection terminals so that two different vibration modes individually appear at the external connection terminals.

According to a third aspect of the present invention, there is provided an oscillation circuit comprising an amplifier, and a feedback part for forming a feedback path connecting across an output end of the amplifier and an input end of the amplifier. The feedback part has a positive feedback path connecting across said output end and said input end and a negative feedback path connecting across said output end and said input end. The negative feedback path which is independent of the positive feedback path has at least two resonance elements having different resonance frequencies and an electric power supply circuit for supplying an electric power supplied from said output end to said resonance elements at a variable division ratio.

The complex resonance circuit of the present invention has a property that an antiresonance frequency thereof can be adjusted by independently changing voltages or currents for exciting vibrations of the resonance elements. An oscillation circuit and a filter utilizing the property of the complex resonance circuit are configured can be operated on the basis of a new frequency controlling method which has not been conventionally known. The present invention opens the way for realizing a frequency controlling method around at an antiresonance frequency and configuring an oscillation circuit utilizing the frequency controlling method. The frequency controlling method has not been turned into actual utilization since a high impedance is accompanied.

A piezoelectric device has a plurality of electrodes which are formed on a piezoelectric substrate such as a quartz substrate known as a MCF (Monolithic Crystal Filter). By disposing and connecting the plurality of electrodes so that a plurality of natural vibration modes are generated, an antiresonance frequency appears between resonance frequencies. The disposition and connection of the electrodes are basically different from a conventional technique. The complex resonance circuit of the present invention utilizes a physical property that the antiresonance frequency can vary in response to a ratio of relative output levels of high-frequency signals flowing to the resonance circuits. The complex resonance circuit of the present invention can eliminate a variable-reactance element such as a variable-capacitance diode indispensable for controlling an oscillation frequency characteristic and a filter frequency characteristic, and therefore, is suitable for decreasing voltage applied thereto and lowering electric current consumption.

Impedances of the filter and the oscillation circuit of the present invention are so high, thus reducing the effectiveness of a resistance component of a peripheral circuitry and exhibiting a high Q-value and an excellent characteristic in a short-term stabilization of an oscillation frequency. The filter of the present invention can exhibit a significant rapid damping characteristic, and in addition, an adjustable-frequency characteristic.

BRIEF DESCRIPTION OF DRAWINGS

FIG. 19A is a schematic drawing showing a vibration displacement distribution of the conventional double-mode filter of FIG. 18 in a natural vibration mode.

FIG. 19B is a schematic drawing showing a vibration displacement distribution of the conventional double-mode filter of FIG. 18 in a natural vibration mode.

FIG. 20 is a graph showing experimental frequency characteristics for a variation of the first embodiment of the complex resonance circuit according to the present invention;

DESCRIPTION OF THE PREFERRED EMBODIMENTS

Figure 1A:
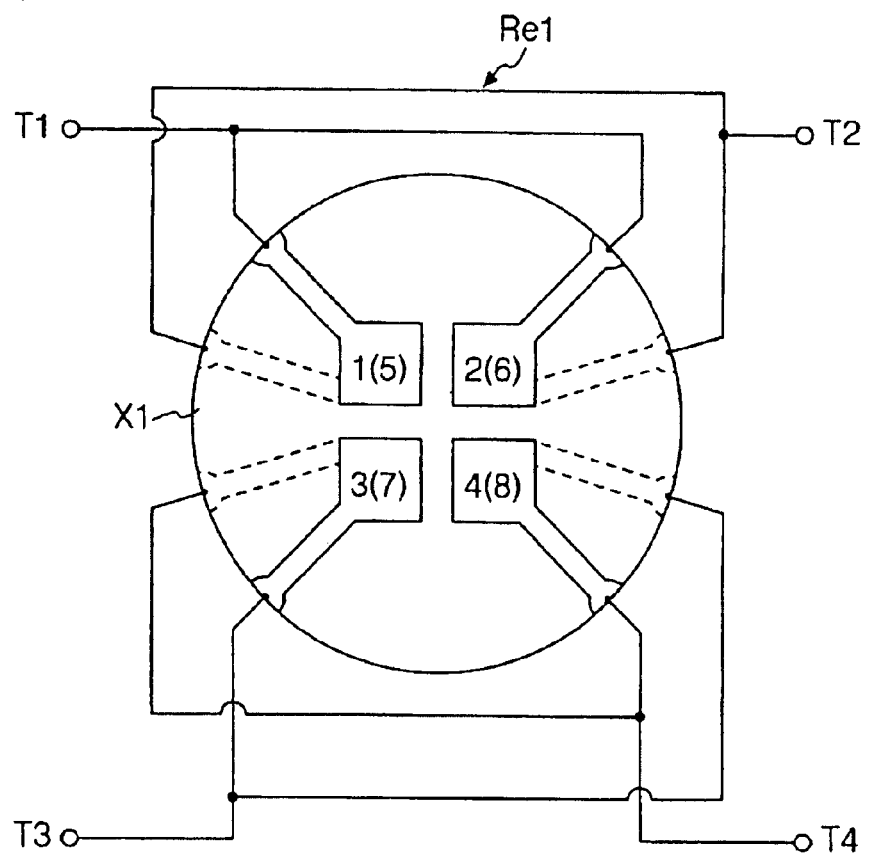
FIG. 1A is a schematic plan view showing a first embodiment of a complex resonance circuit according to the present invention.

Embodiments of the present invention will now be described in detail.

It is well-known that a piezoelectric device such as a piezoelectric vibrator typically has a large number of natural vibration modes. The natural vibration modes can be classified into a number of mode types. Natural vibration modes having a similar vibration characteristic belong to one of the mode groups. On the basis of the vibration characteristic, the mode groups are referred to as, for example, a bending vibration (including a tuning fork vibration), a longitudinal (extensional) vibration, a face shearing vibration, a width-extensional Vibration, a thickness shearing vibration, a thickness longitudinal vibration, a Rayleigh surface wave vibration, a Leakey surface wave vibration, a shear horizontal surface wave vibration, a SMR vibration, and a Stoneley surface wave vibration.

A piezoelectric device such as a piezoelectric vibrator utilizing a selected natural vibration mode group is referred to as a "structural device". Thus, once a structure of, a shape of, and a size of the piezoelectric device are defined, a vibration characteristic of the natural vibration mode can be uniformly described on a dominant conception as is well known even if any materials (piezoelectric material and electrode material) will be used for the piezoelectric device.

A large number of natural vibration modes belonging to the same mode group are referred to as "group natural vibration mode" or "natural vibration mode group". The term "order of mode" is utilized for individually identifying the natural vibration modes of the same groups. The order of mode is also referred to as an "harmonic overtone order" and an "inharmonic overtone order".

The complex resonator of the present invention including a piezoelectric material utilizes at least two natural vibration modes selected from one of natural vibration mode groups. The at least two natural vibration modes correspond to at least two order of mode. Embodiments of the present invention will be described with reference to order of the natural vibration mode.

A piezoelectric device such as a piezoelectric vibrator in which both of a natural vibration mode group and its order are selected is a "structural device". Once a structure of, a shape of, a size of, and a material of the piezoelectric device are defined, a vibrational characteristic of the natural vibration mode can be defined. The piezoelectric device can be universally determined on a dominant conception as is well known, even if any materials (piezoelectric material and electrode material) will be used for the piezoelectric device. If a lowest-order mode of a fundamental wave is selected in a thickness shearing vibration (a natural vibration mode group is selected), a structure and a shape of the piezoelectric vibrator will be completely defined.

If another order of the vibration mode is selected, the shape of the piezoelectric vibrator will be modified, but the structural concept will not be modified. Thus, the piezoelectric device whose structure is modified is also uniformly defined on a generic concept as is well known. Even if, for example, a thickness shearing vibration mode is selected and then a lowest-order of a fundamental wave is replaced by a highest-order of a fundamental wave, the corresponding structure of the piezoelectric vibrator will be completely defined. Therefore, a structure of the piezoelectric device may be defined on the basis of the corresponding one natural vibration mode group.

The present invention can utilize all natural vibration mode groups. In other words, the present invention can be defined by a dominant conception where a technical field individually defined by a structure of a piezoelectric vibrator is included. In order to describe that the present invention utilizes all natural vibration mode groups, three embodiments of the complex resonance circuit according to the present invention are firstly described. The first to third embodiments of the complex resonance circuit according to the present invention utilizes a thickness shearing vibration, a Rayleigh surface wave vibration, and a bending vibration, respectively. Then, the dominant conception utilizing natural vibration modes belonging to all natural vibration mode groups will be described.

Figure 1B:
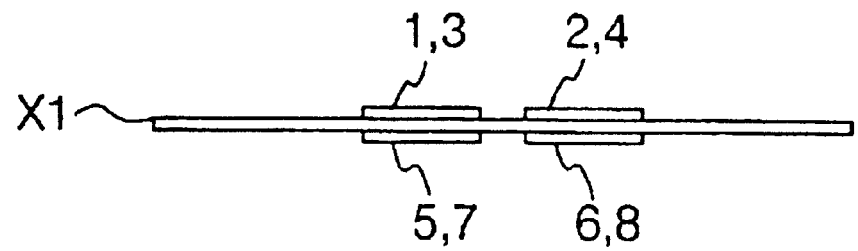
FIG. 1B is a schematic side view showing the first embodiment of the complex resonance circuit according to the present invention.

FIG. 1A is a schematic plan view showing a first embodiment of a complex resonance circuit according to the present invention. FIG. 1B is a schematic side view showing the first embodiment of the complex resonance circuit according to the present invention. The complex resonance circuit utilizes a thickness shearing vibration of a piezoelectric substrate. A plurality of electrodes 1 to 8 are formed on a piezoelectric substrate X1. A piezoelectric device typically has multiple natural vibration modes. A couple of electrodes are connected to the piezoelectric device, and thus some natural vibration modes selected among the multiple natural vibration modes can be induced at the same time by applying a voltage across the electrode. For the sake of selecting a predetermined natural vibration mode, symmetries of and shapes of the electrodes may be appropriately selected. In addition, relative distances between the electrodes and the piezoelectric substrate, and asymmetry of a polarity of a applied signal etc. may be appropriately selected.

The first embodiment of the complex resonance circuit according to the present invention, in which the piezoelectric substrate formed from a piezoelectric material (quartz substrate) is utilized, is also referred to as a "complex resonator". A principle of the present invention, which will be described in reference to the following drawings, is not limited to the embodiments. The complex resonance circuit according to the present invention includes a complex resonance circuit having other piezoelectric materials such as a ceramic. The complex resonance circuit may be configured by at least one strip line element.

As shown in FIGS. 1A and 1B, a complex resonator Re1 includes, a first electrode 1, a second electrode 2, a third electrode 3, and a fourth electrode 4 adjacently formed on a front surface of the disciform quartz piezoelectric substrate X1. The first electrode 1, the second electrode 2, the third electrode 3, and the fourth electrode 4 face to each other. The complex resonator Re1 further includes a fifth electrode 5, a sixth electrode 6, a seventh electrode 7, and an eighth electrode 8 formed on a rear surface of the piezoelectric substrate X1. The fifth, sixth, seventh, and eighth electrodes 5, 6, 7, and 8 are opposed to the first, second, third, and fourth electrodes 1, 2, 3, and 4, respectively, via the piezoelectric substrate X1. Lead wires extending to the periphery of the piezoelectric substrate X1 are respectively connected to the electrodes. The electrodes are connected to other electrodes or external connection terminals T1, T2, T3, and T4. In FIG. 1A, the electrodes formed on the rear surface of the piezoelectric substrate X1 are denoted by numerals (5), (6), (7), and (8) and the lead wires etc. formed on the rear surface are denoted by dotted lines.

The connection between the lead wires and the electrodes will now be described. As shown in FIG. 1A, the electrodes are connected to each other via the lead wires. Both of the first electrode 1 and the second electrode 2 are connected to a first external terminal T1. Both of the fifth electrode 5 and the sixth electrode 6 are connected to a second external terminal T2. Both of the third electrode 3 and the eighth electrode 8 are connected to a third external terminal T3. Both of the fourth electrode 4 and the seventh electrode 7 are connected to a fourth external terminal T4.

In the first embodiment of the present invention, the complex resonator includes at least two electrode pairs formed on the front surface of the piezoelectric substrate and at least two electrode pairs formed on the rear surface so that each of the electrode pairs is independently piezoelectrically coupled to the piezoelectric substrate. For the purpose of suppressing spurious vibration excitations, it is preferable that the four electrode pairs are formed on principal surfaces of the piezoelectric substrate so as to be substantially symmetrical to each other in the horizontal and vertical directions of principal surfaces of the substrate. As shown in FIG. 1A, it is not indispensably required that the electrodes are symmetric with respect to a center point of the piezoelectric substrate.

Sizes of the electrodes of the first embodiment will now be specifically described. In FIGS. 1A and 1B, the piezoelectric plate X1, which is an AT-cur circular quartz substrate having a diameter of about 8 mm, excites a resonance vibration frequency of about 10 MHz. The electrodes have a square shape having 1.5 mm on one side and are separated from each other by a distance of about 0.3 mm. The electrodes are arranged in the middle of the piezoelectric plate X1 so as to be substantially symmetric to each other in the vertical and horizontal directions of the piezoelectric plate X1. Each of the lead wires has a width of about 0.3 mm. In a circumferential portion of the piezoelectric plate X1, the lead wires are connected to the external connection terminals T via a conductive adhesive etc. The electrodes and the lead wires, which are formed from an Ag film with a 150 nm thickness, are formed by evaporating under vacuum.

The complex resonator Re1 of FIG. 1A is characterized by the arrangement of the electrodes and the interconnections between the electrodes. Both of the first electrode 1 and the second electrode 2, which are formed on the front surface of the piezoelectric substrate X1, are connected to the external terminal T1. Both of the fifth electrode 5 and the sixth electrode 6, which are formed on the rear surface of the piezoelectric substrate X1, are connected to the terminal T2. Both of the third electrode 3 and the eighth electrode 8 which is not opposed to the third electrode 3 is connected to the third terminal T3. Both of the fourth electrode 4 and the seventh electrode 7 which is not opposed to the fourth electrode 4 are connected to the fourth terminal T4.

In consideration of differences between the vibration modes which respectively appear to external electrode pairs, the external terminal pairs are distinctively defined as a positive terminal pair and a negative terminal pair, respectively. For instance, in the case that an external terminal pair of T1 and T2 are defined as a positive terminal pair, both of the first electrode 1 and the second electrode 2 are connected to the terminal T1 and both of the fifth electrode 5 and the sixth electrode 6 are connected to the terminal T2. In other wards, two electrodes formed on the front surface of the piezoelectric substrate and two electrodes formed on the rear surface of the piezoelectric substrate are connected to the external electrode pair of T1 and T2, respectively.

On the other hand, an external terminal pair of T3 and T4, across which a vibration mode different from the positive terminal pair appears, is distinctively defined as a negative terminal pair. Both of the third electrode 3 and the eighth electrode 8 are connected to the terminal T3 which is one terminal of the negative terminal pair. Both of the fourth electrode 4 and the seventh electrode 7 are connected to terminal T4 which is the other terminal of the negative terminal pair. In other wards, two electrodes respectively formed on the different surfaces of the piezoelectric substrate and two electrodes formed on the different surfaces of the piezoelectric substrate are connected to the external electrode pair of T3 and T4, respectively. The connection of the electrodes to the positive terminal pair is defined as a positive polarity connection. The connection of the electrodes to the negative terminal pair is defined as a negative polarity connection whose polarity is opposite to the positive polarity connection.

An electrode structure and an operation of the first embodiment will now be described for clarifying a basic idea of the present invention in comparison with a conventional piezoelectric device.

Figure 18:
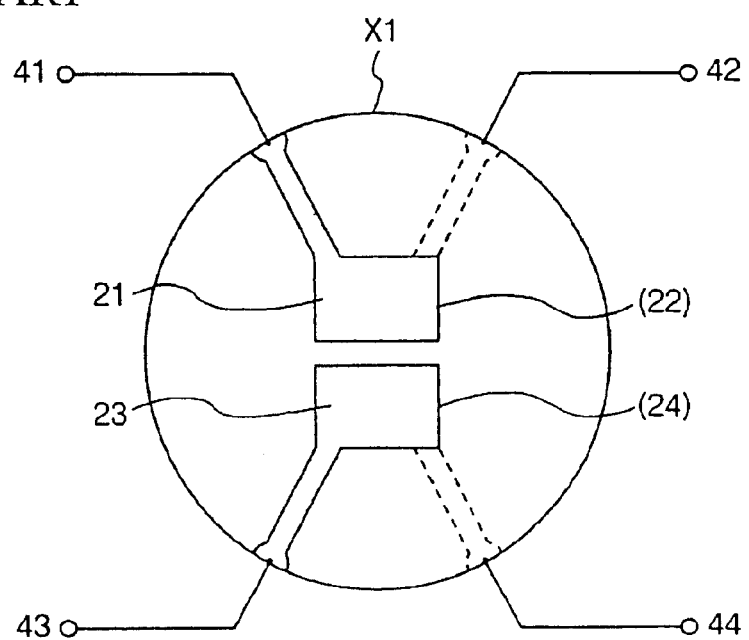
FIG. 18 is a schematic circuit diagram showing a conventional double-mode filter.

A double-mode piezoelectric filter having, for example, an electrode structure shown in FIG. 18, is conventionally known. Two electrode pairs of 21 (22) and 23 (24) are opposite to each other with respect to a piezoelectric substrate X1. The electrodes 21 (22) and 23 (24) are slightly separated by a distance. The electrodes 21 and 22 are respectively connected to the external electrodes 41 and 42 via lead wires. The electrodes 23 and 24 are respectively connected to the external electrodes 43 and 44 via lead wires. In the electrode structure, one of the two electrode pairs is formed on a front surface of the piezoelectric substrate X1 and the other of the two electrode pairs is formed on a rear surface of the piezoelectric substrate X1. In the electrode structure, two natural vibration modes appear, one of which is a symmetrical mode as shown in FIG. 19A and the other of which is an asymmetrical mode as shown in FIG. 19B. In the asymmetrical mode shown in FIG. 19B, the piezoelectric substrate asymmetrically vibrates in the vertical direction. As shown in FIG. 18, the number of the electrodes formed on piezoelectric filter is basically four. The number of electrodes is dependent on operation status of the piezoelectric filter. The number of electrodes is three in the case that two electrodes formed on one surface of the piezoelectric substrate are connected to one as a common electrode.

Meanwhile, the first embodiment of the complex resonator Re1 shown in FIG. 1B includes eight electrodes, four of which are formed on the front surface of the piezoelectric substrate and four of which are formed on the rear surface reverse to the front surface. (As will be described later, in the case of sharing the electrodes, a complex resonator includes six electrodes, three of which are formed on a front surface and three of which are formed on a rear surface) It is understood from the comparison of both electrode structures that the complex resonator of the present invention is basically different from the conventional piezoelectric device.

Furthermore, the complex resonator of the present invention is completely different from the conventional piezoelectric filter in a point of its performance and operation. The conventional piezoelectric filter utilizes some natural vibration modes selected among multiple natural vibration modes and the natural vibration modes can be excited at the same time. The conventional piezoelectric filter has a filtering function by utilizing plural natural vibration modes. The plural natural vibration modes are uniquely determined from the electrode structure. On the other hand, the complex resonator of the present invention includes at least one electrode pair or two electrode pairs and generates different natural vibration modes at the same time. As will be described in later, the complex resonator of the present invention utilizes a physical phenomenon not known conventionally.

As shown in FIG. 1B, the complex resonator Re1 has the piezoelectric substrate, on one principal surface of which the four electrodes are formed and on the other principal surface of which the four electrodes are formed. A distance between the electrodes, which is configured to be 0.3 mm, is small in comparison with the size of the electrode, so that the piezoelectric substrate and all electrode surfaces integrally vibrate. In addition, the electrodes are arranged on the piezoelectric substrate on the basis of polarities. Thus, a plurality of natural vibration modes appear as shown in FIGS. 2A to 2F. Each of FIGS. 2A to 2F conceptually illustrates a contour map of vibration amplitude of a natural vibration mode so as to represent a vibration displacement in two-dimensional. Although sizes of circles and ellipses shown in FIGS. 2A to 2F are schematically illustrated, piezoelectric substrates (quartz plates) X1 are illustrated so as to have the same diameter and be arranged in the same direction.

Amplitude of vibration displacement in a marginal portion of a quartz plate is typically zero. Each of FIGS. 2A to 2F indicates that vibration displacement increases in amplitude as the number of contour lines increase. For instance, in FIG. 2A, an absolute value of the vibration displacement has the maximum at a center of the piezoelectric substrate (quartz plate) X1. Directions of the vibration displacement are denoted by solid and dotted lines of each of FIGS. 2A to 2F, whose vibration directions are reverse to each other.

Figure 2A:
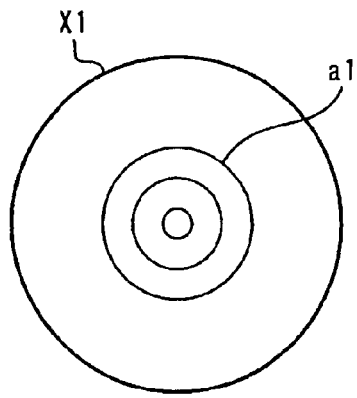
FIG. 2A is a schematic drawing showing a vibration displacement distribution of the complex resonance circuit according to the present invention in a natural vibration mode.
Figure 2B:
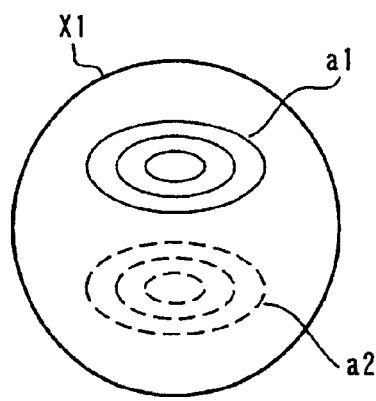
FIG. 2B is a schematic drawing showing a vibration displacement distribution of the complex resonance circuit according to the present invention in a natural vibration mode.

In the first embodiment of the complex resonance circuit shown in FIG. 1A, each of the electrodes is configured so as to have the same size. These electrodes are arranged on the quartz plate so as to be substantially symmetric with respect to the piezoelectric substrate X1 in the vertical and horizontal directions. As described, the polarities of the electrodes are configured in the following way. As shown in FIG. 1A, the electrode pair of the first electrode and the second electrode, which pair is arranged on an upper part of the front surface of the piezoelectric substrate X1, has the same polarity as the terminal pair of the fifth electrode and the sixth electrode, which pair is arranged on the upper part of the rear surface of the piezoelectric substrate X1. The terminal pair of the third electrode and the eighth electrodes which are respectively arranged on a lower part of the front and rear surface of the piezoelectric substrate X1 shown FIG. 1A, has the same polarity as the terminal pair of the seventh electrode and the fourth electrodes which are respectively arranged on the lower part of the front and rear surface. The former two electrodes pairs have the same polarity opposed to that of the latter two electrode pairs. Therefore, two natural vibration modes of FIGS. 2A and 2B are efficiently excited by applying a high-frequency electric current across the external terminals T1 and T2. In addition, two natural vibration modes shown in FIGS. 2C and 2D are efficiently excited by applying a high-frequency electric current across the external terminals T3 and T4.

The first and second electrodes 1, 2 and the fifth and sixth electrodes 5, 6 respectively opposed to the first and second electrodes 1, 2 are disposed on the upper part of the piezoelectric substrate X1, and thus the natural vibration mode of FIG. 2B is excited. FIG. 2A shows that the piezoelectric substrate X1 vibrates at a vibration displacement a1 denoted by the solid line whose direction is a forward direction and also shows that the piezoelectric substrate X1 vibrates symmetrically in the vertical and horizontal directions. The counter map of FIG. 2B shows that the upper portion of the piezoelectric substrate X1 vibrates at a vibration displacement a1 denoted by solid line whose direction is a forward direction and also shows that the lower portion of the piezoelectric substrate X1 vibrates at a vibration displacement a2 denoted by the dotted line whose direction is reverse to the forward direction. FIG. 2B shows that the vibration of the piezoelectric substrate X1 is substantially symmetric in the horizontal direction and substantially asymmetric in the vertical direction.

Figure 2C:
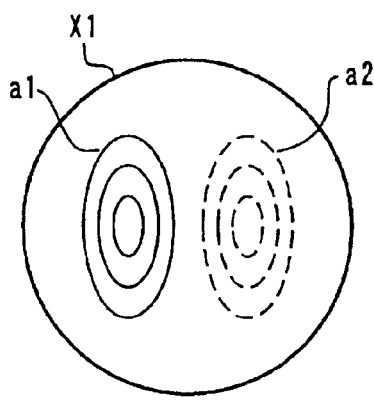
FIG. 2C is a schematic drawing showing a vibration displacement distribution of the complex resonance circuit according to the present invention in a natural vibration mode.
Figure 2D:
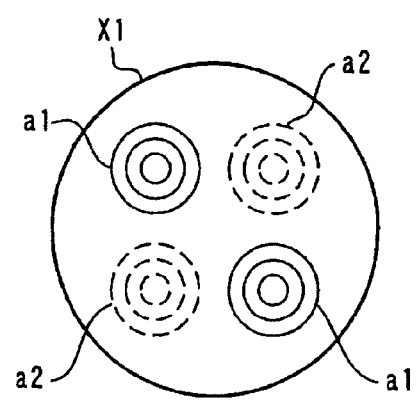
FIG. 2D is a schematic drawing showing a vibration displacement distribution of the complex resonance circuit according to the present invention in a natural vibration mode.

Natural vibration modes shown in FIGS. 2C and 2D are characterized by vibration displacements which are substantially asymmetric in the horizontal direction. The vibration displacement of FIG. 2C is substantially symmetric in the vertical direction and the vibration displacement of FIG. 2D is substantially asymmetric in the vertical direction. These natural vibration modes have corresponding natural vibration frequencies. In similar to a conventional piezoelectric vibrator, the absolute values and the relative values (a frequency difference between two natural vibration frequencies) of these natural vibration frequencies are dependent upon material constants, shapes, and sizes of the piezoelectric substrate and the electrodes constituting the piezoelectric vibrator.

Figure 3:
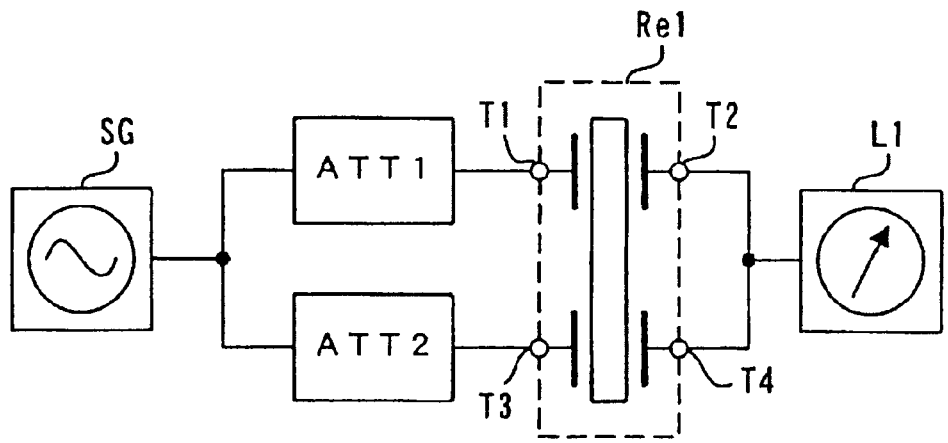
FIG. 3 is a schematic circuit diagram showing a measuring circuit for measuring a frequency characteristic of the complex resonance circuit according to the present invention.

Frequency characteristics for the complex resonator Re1 of the first embodiment are measured via the external terminals with a measuring circuit shown in FIG. 3. The measuring circuit includes a high-frequency signal generator SG for supplying an input signal to the external terminals T1 and T3 of the complex resonator Re1 show in FIG. 1A via attenuators ATT1 and ATT2. The measuring circuit further includes a level measuring instrument L1 for measuring an output signal level from the external terminals T2 and T4. The complex resonator Re1, which is the quartz resonator of the first embodiment shown in FIG. 1A, is schematically illustrated in FIG. 3.

Figure 4:
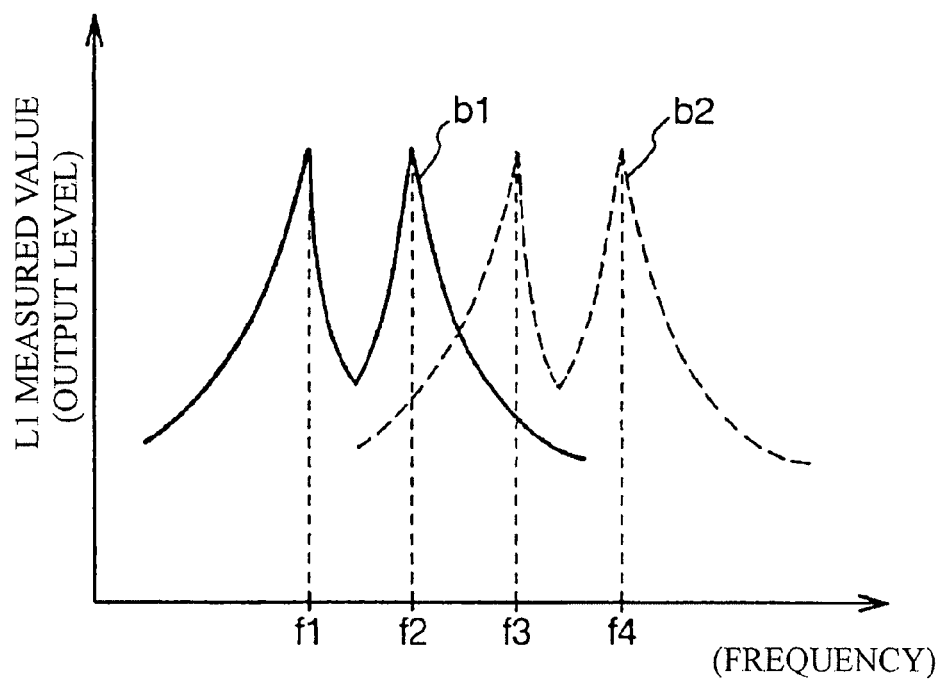
FIG. 4 is a graph showing frequency characteristics for the first embodiment of the complex resonance circuit according to the present invention.

A measurement result observed with the level measuring instrument L1 is shown in FIG. 4. FIG. 4 is a graph showing frequency characteristic curves for the first embodiment of the complex resonator according to the present invention. The frequency characteristic curve b1 is observed by varying a frequency of the input signal supplied to the complex resonator Re1 under a configuration condition that an attenuation value of the attenuator ATT1 of FIG. 3 is 0 dB, an attenuation value of the attenuator ATT2 is 100 dB, and an amplitude of the input signal supplied from SG is constant. Under such the configuration condition, an output signal observed by the level measuring instrument L1 is dominated by the input signal from the attenuator ATT1. This behavior results from influences of the natural vibration modes respectively appearing to the first and second electrodes 1, 2 and the fifth and sixth electrodes 5, 6 arranged on the rear surface of the piezoelectric substrate X1.

Under such the configuration, a frequency characteristic curve b1 denoted by a solid line of FIG. 4 is observed. As shown in FIG. 4, the frequency characteristic curve b1 has two peaks at frequencies f1=9.82272 MHz and f2=9.85290 MHz which correspond to resonance frequencies.

Next, when the attenuation value of the attenuator ATT1 is increased from 10 to 20 dB, an frequency characteristic curve (not shown) similar to the frequency characteristic curve b1 having two peaks at f1 and f2 is observed. However, the intensity of the frequency characteristic curve entirely decreases and the frequency characteristic curve shifts in a direction toward to lower output level (vertical axis) in parallel, resulting from the increase in the attenuation value of the attenuator ATT1. Frequencies of the two peaks at f1 and f2 ascribed to resonance frequencies do not substantially shift. It is considered that the two frequencies f1 and f2 correspond to the natural vibration frequencies causing the vibration displacements of FIGS. 2A and 2B, respectively.

Next, a measurement is performed while varying a frequency of the input signal supplied to the complex resonator Re1 under a configuration condition that an attenuation of the attenuator ATT1 is 100 dB, an attenuation of the attenuator ATT2 is 0 dB, and an amplitude of the input signal supplied from SG is constant. Under such the configuration condition, a frequency characteristic curve b2 denoted by a dotted line of FIG. 4 is observed. The frequency characteristic curve b2 has two peaks at frequencies f3=9.86763 MHz and f4=9.89735 MHz f3 corresponding to resonance frequencies.

Next, when the attenuation value of the attenuator ATT2 is increased from 10 to 20 dB, an frequency characteristic curve (not shown) similar to the frequency characteristic curve b2 having two peaks at f3 and f4 is observed. However, the intensity of the frequency characteristic curve entirely decreases and the frequency characteristic curve shifts in a direction toward to lower output level (vertical axis) in parallel, resulting from the increase in the attenuation value of the attenuator ATT2. Frequencies of the two peaks at f3 and f4 ascribed to resonance frequencies do not substantially shift. It is considered that the two frequencies f3 and f4 correspond to the natural vibration frequencies causing the vibration displacements of FIGS. 2C and 2D, respectively.

The above-described measurement result will now be summarized as follows. Under such the configuration condition that the attenuation value of the attenuator ATT1 is 0 dB and the attenuation value of the attenuator ATT2 is 100 dB, the frequency characteristic curve b1 having the two peaks at the frequencies f1 and f2 is observed. Under such the configuration condition that the attenuation value of the attenuator ATT1 is 100 dB and the attenuation value of the attenuator ATT2 is 0 dB, the frequency characteristic curve b2 having the two peaks at the frequencies f3 and f4 is observed.

Figure 5:
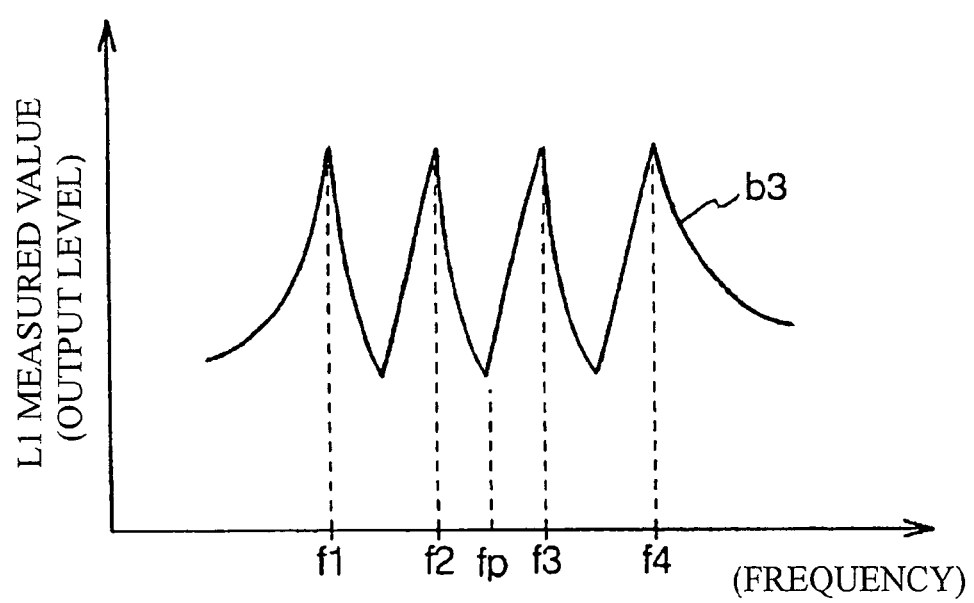
FIG. 5 is a graph showing frequency characteristics for the first embodiment of the complex resonance circuit according to the present invention.

Next, under a configuration condition that both attenuation values of the attenuator ATT1 and the attenuator ATT2 are 0 dB, a frequency characteristic curve b3 of FIG. 5 is observed.

It is apparent from the frequency characteristic curve b3 that a dip corresponding to an antiresonance frequency fp appears between two resonance frequencies f2 and f3.

A frequency characteristic of the resonance circuit according to the present invention will now be described. An antiresonance frequency fp appearing between resonance frequencies f2 and f3 can be adjusted by changing a difference in attenuation values between the attenuators ATT1 and ATT2 of FIG. 3.

Figure 6A:
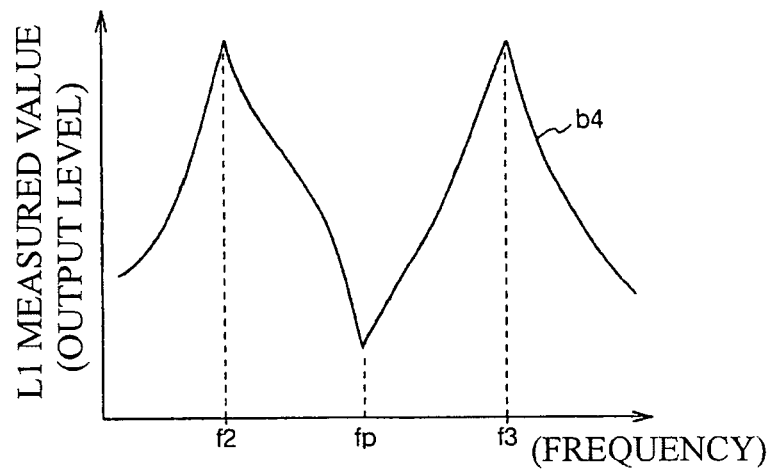
FIG. 6A is a graph showing frequency characteristics for the first embodiment of the complex resonance circuit according to the present invention.
Figure 6B:
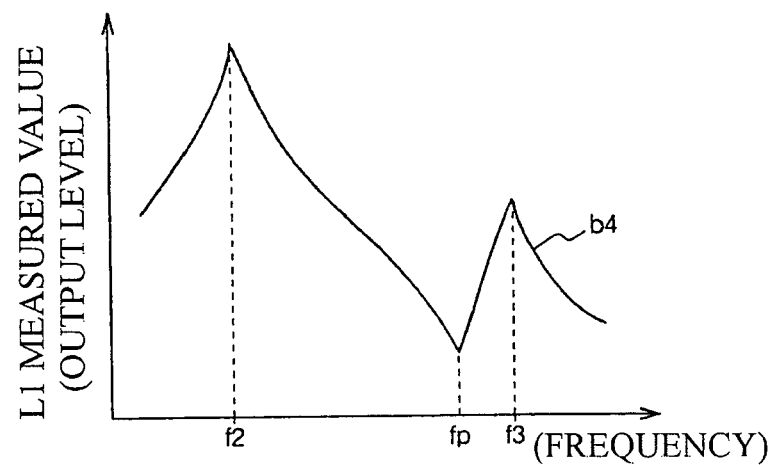
FIG. 6B is a graph showing frequency characteristics for the first embodiment of the complex resonance circuit according to the present invention.
Figure 6C:
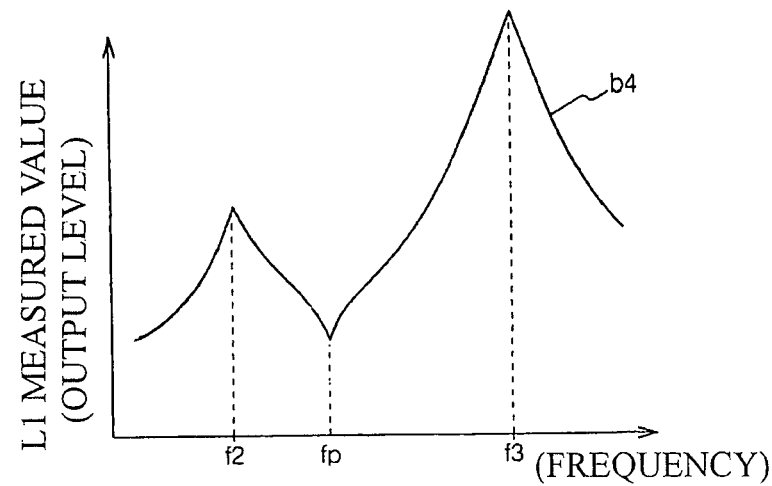
FIG. 6C is a graph showing frequency characteristics for the first embodiment of the complex resonance circuit according to the present invention.

FIGS. 6A to 6C are graphs showing frequency characteristic curves for the first embodiment of the complex resonance circuit according to the present invention, which curves are around between resonance frequencies f2 and f3. FIGS. 6A to 6C show that an antiresonance frequency fp can be adjusted between two resonance frequencies f2 and f3 by changing a difference in attenuation values between the attenuators ATT1 and ATT2.

FIG. 6A is a graph of a frequency characteristic curve b4 for the first embodiment, which curve is observed under the configuration that the attenuators ATT1 and ATT2 have the same attenuation values. As shown in FIG. 6A, the observed frequency characteristic curve b4 has a dip corresponding to an antiresonance frequency fp at a substantial midpoint of frequencies f2 and f3. FIG. 6B is a graph of a frequency characteristic curve b4 for the first embodiment, which curve is observed under the configuration that an attenuation value of the attenuator ATT2 is larger than that of the attenuator ATT1. As shown in FIG. 6B, the observed frequency characteristic curve b4 has a dip corresponding to an antiresonance frequency fp between frequencies f2 and f3, and in particular, close to f3. FIG. 6C is a graph of a frequency characteristic curve b4 for the first embodiment, which curve is observed under the configuration that an attenuation value of the attenuator ATT1 is larger that that of the attenuator ATT2. As shown in FIG. 6C, the observed frequency characteristic curve b4 has a dip corresponding to an antiresonance frequency fp between frequencies f2 and f3, and in particular, close to f2.

As is clear from the experimental results, it is understood that the antiresonance frequency fp can be varied by continuously changing the difference in attenuation values between the attenuators ATT1 and ATT2.

Figure 7:
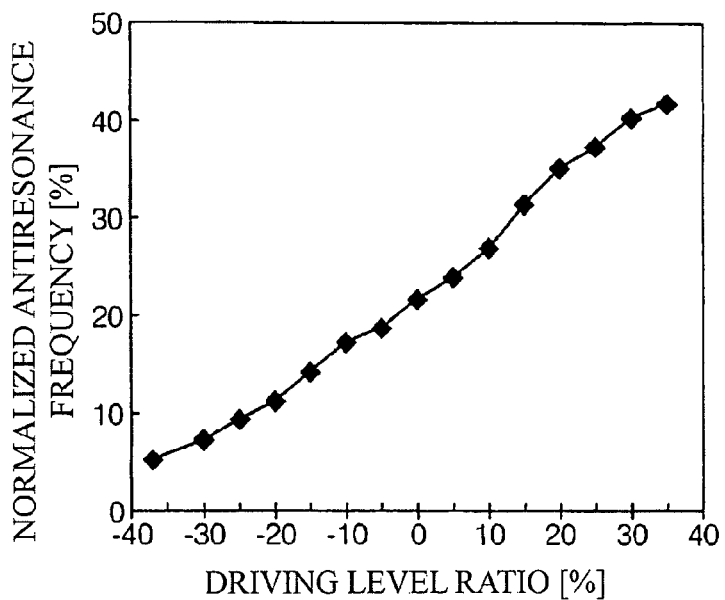
FIG. 7 is a graph showing experimental frequency characteristics for the first embodiment of the complex resonance circuit according to the present invention.

FIG. 7 is a graph showing antiresonance frequency characteristics for the first embodiment. The vertical axis of FIG. 7 corresponds to a normalized antiresonance frequency value which is normalized by configuring that a lower frequency f2 is 0% and a higher frequency f3 is 100%. The horizontal axis corresponds a relative value between attenuation values of the attenuators ATT1 and ATT2.

The zero-point on the horizontal axis corresponds to the case that both of the attenuation values are equal to each other. The negative direction along the horizontal axis corresponds to an increase of the attenuation value of the attenuator ATT1 at the time when the attenuation value of the attenuator ATT2 is 0 dB. The attenuator ATT1 is connected to the external terminals T1 and T2 to which a lower natural vibration mode appears. The attenuator ATT2 is connected to the external terminals T3 and T4 to which a higher natural vibration mode appears. The positive direction along the horizontal axis corresponds to an increase of the attenuation value of the attenuator ATT2 at the time when the attenuation value of the attenuator ATT1 is 0 dB.

It is to be noted that the measuring circuit of FIG. 3 further includes an impedance matching type power divider (not shown) connected across a high frequency signal generator SG and the two attenuators ATT1 and ATT2. It is conventionally known to utilize the impedance matching type power divide. For the sake of simplifying a relation between the attenuation values of the attenuators ATT1 and ATT2 and applied voltages on the external terminals T1 and T3, the impedance matching type power divider is not shown in FIG. 3.

It is understood from FIG. 7 that the value of antiresonance frequency fp can be widely varied over the wide rage up to 35% which value corresponds to the difference between the frequencies f2 and f3 and an absolute value of 500 ppm.

The first embodiment of the complex resonance circuit according to the present invention can be modified so that the piezoelectric substrate shown in FIG. 1A is replaced by two conventional piezoelectric vibrators Q1 and Q2. In a first variation of the first embodiment too, an antiresonance frequency fp can be adjusted by utilizing the conventional piezoelectric vibrators Q1 and Q2.

A frequency variable effect made by two quartz resonators employed as the piezoelectric vibrator will now be described with reference to the circuit of FIG. 3. The quartz resonator Re1 of FIG. 3 is replaced by two quartz resonator. A quartz resonator Q1 is connected across the external terminals T1 and T2 shown in FIG. 3. A quartz resonator Q2 is connected across external the terminals T3 and T4 shown in FIG. 3. Resonance frequencies of the two quartz resonators Q1 and Q2 is 9.995200 MHz and 10.005116 MHz, respectively. Each of the quartz resonators Q1 and Q2 is formed from a disciform AT-cut quartz substrate having a diameter of 6.5 mm, on which circular electrodes having a diameter of 3 mm are formed. The circular electrodes are formed by evaporating silver under vacuum. It is configured that a range of a frequency drop plate back frequency is about 70 kHz. The quartz resonators having the electrode are electrically attached to a HC-49/U package with a conductive adhesive, and then the quartz plate are hermetically sealed under dry nitrogen.

Frequency characteristics for the complex resonator including the resonators Q1 and Q2 are observed by the measurement circuit of FIG. 3. Two peaks ascribed to the spurious peaks f1 and f4 which are observed in the first embodiment of FIG. 1A, are not observed. Two peaks corresponding to the resonance frequencies f2 and f3 are observed for the first variation of the first embodiment having the two quartz resonators Q1 and Q2. Therefore, frequency characteristics similar to FIGS. 6A to 6C are observed by the measuring circuit of FIG. 3 to which the quartz resonators Q1 and Q2 are connected.

In similar to FIG. 7, antiresonance frequency characteristics for the first variation of the first embodiment having the two piezoelectric resonators Q1 and Q2 are observed while changing a difference in attenuation values between the attenuator ATT1 and ATT2. FIG. 20 is a graph of antiresonance frequency characteristics for the first variation of the first embodiment having the piezoelectric resonators Q1 and Q2. It is understood from FIG. 20 that values of the antiresonance frequency fp can be adjusted over a wide rage up to 93.4% of a frequency difference between the resonance frequencies f2 and f3. An absolute value of the maximum normalized antiresonance frequency is 926 ppm.

Even if the two piezoelectric vibrators are separately disposed and connected to a plurality of electrodes, in the case of vibration modes due to an energy trapping effect, the two piezoelectric vibrators can make effects similar to one piezoelectric substrate having two separate portions which are uniformly spaced.

In FIG. 7, the normalized frequency does not reach 50% at 0 dB, that is, under a condition that both attenuation values of the two attenuators are equal to each other. The reason is speculated as follows. As shown in FIG. 3, the piezoelectric vibrator of the first embodiment has two portions, one of which is connected across the external terminals T1 and T2 and the other of which is connected across the external terminals T3 and T4. Since each of the portions of the piezoelectric vibrator in the complex resonator has a parallel capacity, Q-value (sharpness of the peak resonance) of the piezoelectric vibrator is low. Accompanied by the low Q-value, each of the frequency characteristic curves b1 to b4 of FIGS. 4 to 6 is horizontally asymmetric in the horizontal axis. The piezoelectric substrate used for the piezoelectric vibrator observed in FIG. 7 excites a thickness shear vibration mode on the AT-cut quartz substrate, so that the capacitance ratio is about 250. Therefore, the asymmetry of the frequency characteristic curves b1 to b4 is originated from such the high capacitance ratio.

The asymmetry of the frequency characteristic curves depends on the piezoelectric substrate used in the complex resonator of the present invention. The asymmetry also depends on a capacitance ratio (or an electromechanical coupling factor) peculiar to the natural vibration modes excited in the piezoelectric substrate. Although the asymmetry decreases as the capacitance ratio decreases, the asymmetry can be reduced by cancelling the parallel capacity of the piezoelectric vibrator.

For the purpose of cancelling the parallel capacities of the piezoelectric vibrator, the complex resonator according to the present invention may include coils which are respectively connected across T1 and T2 and across T3 and T4. The coil has an inductance value so as to cause a parallel resonance by which the parallel capacity is cancelled. In addition, the complex resonator according to the present invention may utilize a bridge balance method or includes a T-shaped circuit having a condenser and a coil. The bridge balance method or the T-shaped circuit having a condenser and a coil will be described later together with an oscillation circuit.

As shown in FIGS. 7 and 20, in the first embodiment and the first variation of the first embodiment, it is observed that the antiresonance frequency fp is preferably correlated with the difference in attenuation values between the two attenuators. A theoretical analysis of the correlation will now be described with reference to FIG. 21A.

Figure 21A:
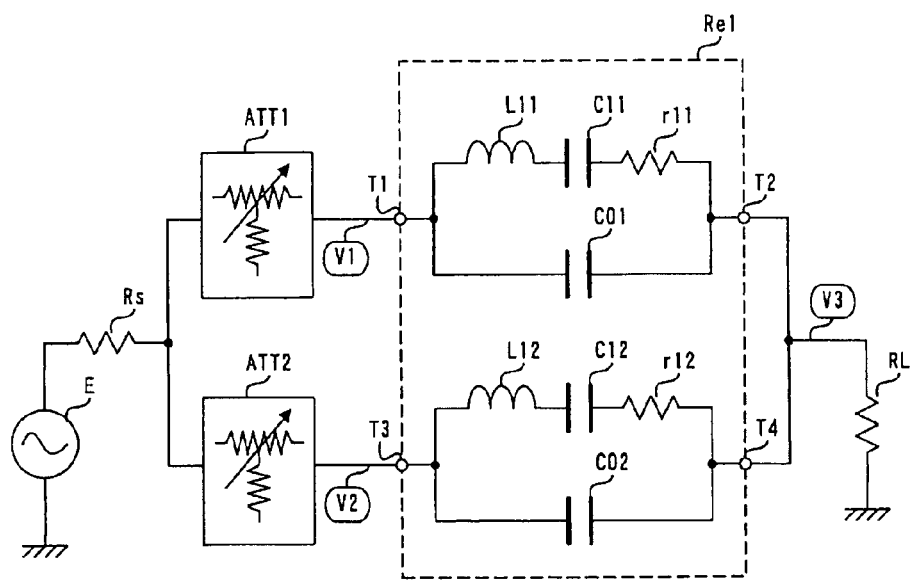
FIG. 21A is a schematic circuit diagram showing an equivalent circuit representing the complex resonance circuit according to the present invention.

The measuring circuit shown in FIG. 3 can be replaced by an equivalent circuit shown in FIG. 21A. The high frequency signal generator SG of FIG. 3 corresponds to an AC power source E and a resistance RS of FIG. 21A. The level measurement instrument L1 of FIG. 3 corresponds to a resistance RL of FIG. 21A. In the case that the complex resonator Re1 of FIG. 3 corresponds to, for example, the complex resonator of FIG. 1A, it is understood from the electrode structure and the electrode connection shown FIG. 1A that the complex resonator of FIG. 1A excites at two natural vibrational modes on the one piezoelectric substrate. This is because that the two natural vibrational modes are orthogonal to each other as shown in FIGS. 2B and 2C.

In the first variation of the first embodiment, the complex resonator Re1 of FIG. 3 corresponds to the two piezoelectric resonators Q1 and Q2 which are individually connected to the measuring circuit. Thus, the two piezoelectric resonators independently excite different vibrational modes. Thus, the complex resonator Re1 shown in FIG. 3 can be also replaced by two typical equivalent circuits surrounded by a dotted line of FIG. 21A. Each of the typical equivalent circuits is represented by four equivalent constants. The complex resonator Re1 between the external terminals T1 and T2 of FIG. 3 corresponds to the equivalent circuit between terminals T1 and T2 shown in FIG. 21A. The complex resonator Re1 between the external terminals T3 and T4 of FIG. 3 corresponds to the equivalent circuit between terminals T3 and T4 shown in FIG. 21A. The equivalent circuit between the terminals T1 and T2 of FIG. 21A has a parallel circuit configured by L11, C11, r11, and CO1. L11, C11, r11 are connected in series. The equivalent circuit between the terminals T3 and T4 of FIG. 21A has a parallel circuit configured by L12, C12, r12, and CO2. L12, C12, r12 are connected in series. An output voltage of the attenuator ATT1 of FIG. 3 is defined as V1. An output voltage of the attenuator ATT2 of FIG. 3 is defined as V2. An output voltage of the level measurement instrument L1 of FIG. 3 is defined as V3 which is a voltage across both ends of the resistance RL.

Figure 21B:
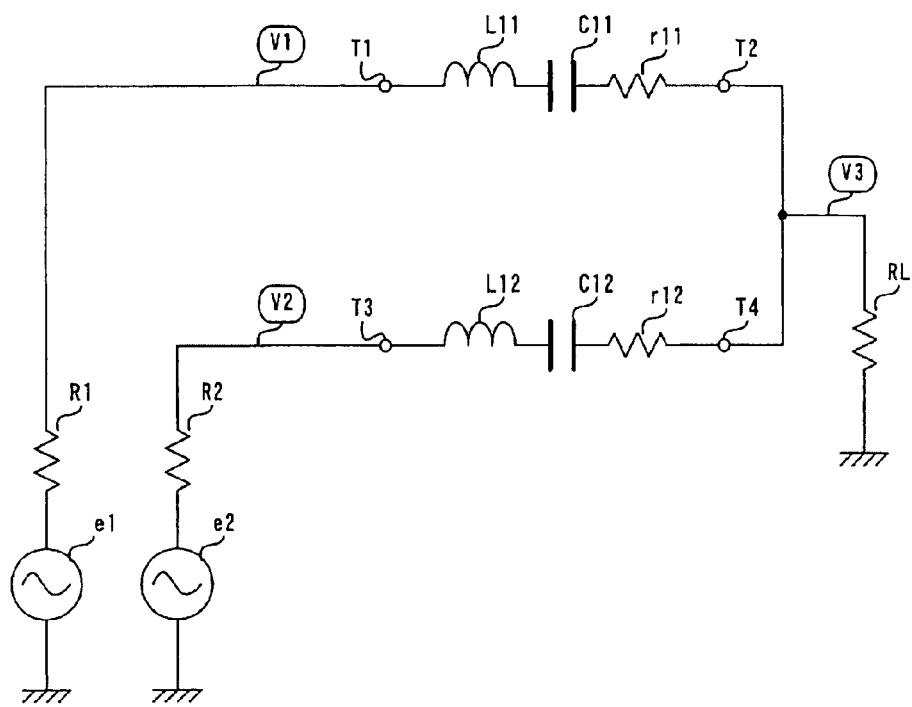
FIG. 21B is a schematic circuit diagram showing an equivalent circuit representing the complex resonance circuit according to the present invention.

Furthermore, the equivalent circuit shown in FIG. 21A can be replaced by an equivalent circuit shown in FIG. 21B. The AC power source E, the resistance RS, the attenuator ATT1, and the attenuator ATT2 of FIG. 21A can be represented as two AC power sources e1, e2 and two resistances R1, R2 as shown FIG. 21B. Amplitudes of the two AC power sources e1, e2 and values of the resistances R1, R2 are configured so that voltages V1 to V3 at terminals shown in FIG. 21B are equivalent to those of FIG. 21A.

The complex resonator Re1 of the equivalent circuit of FIG. 21A is not essentially influenced by two parallel capacities C01 and C02, both of which can be canceled as will be described later. Therefore, the equivalent circuit of FIG. 21B, in which two parallel capacities C01 and C02 are disregarded, will be described.

A purpose of analyzing the equivalent circuit of FIG. 21B is to clarify a dependence of the antiresonance frequency fp in response to the voltages V1 and V2. For this purpose, only a zero-point of a transfer function of the equivalent circuit of FIG. 21B may be calculated. In other words, a zero-point of an output current IL may be calculated when a resistance RL is adjusted to be zero. If resistances of r11 and r12 of the complex resonator shown in FIG. 21B are assumed to be 0 for the sake of simplicity, the equivalent circuit of FIG. 21B can be partially replaced by an equivalent circuit shown in FIG. 21C.

Figure 21C:
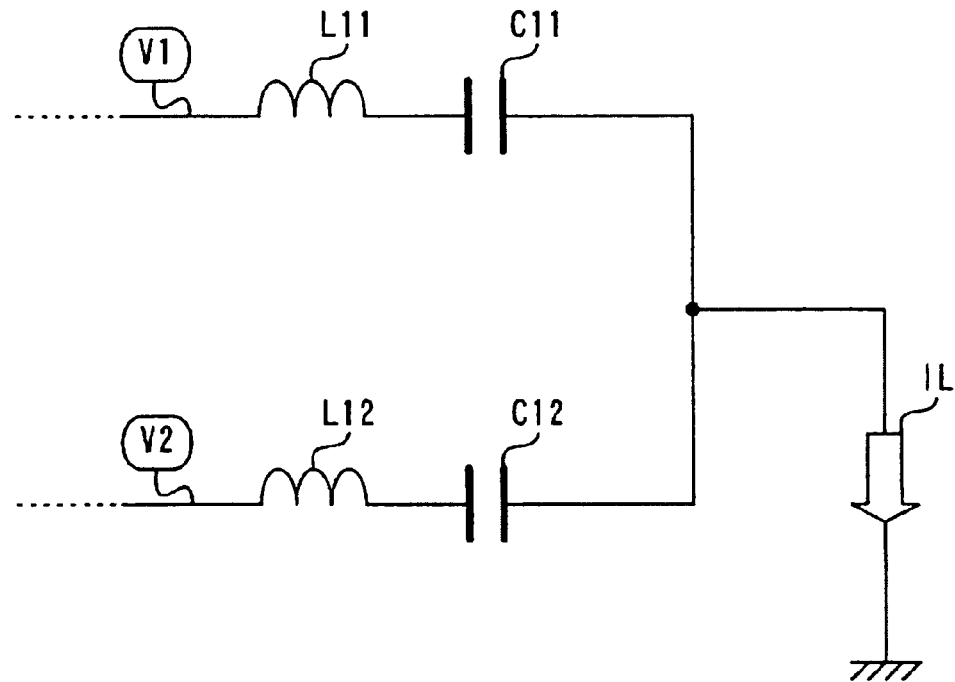
FIG. 21C is a schematic circuit diagram showing an equivalent circuit representing the complex resonance circuit according to the present invention.

The output current IL of the equivalent circuit of FIG. 21C is calculated by using the voltages V1 and V2 on the basis of the superposition principle. Since a numerator of the transfer function is not zero, a condition under which a denominator of the transfer function becomes 0 is given by the following equation.

$$IL \propto V1\left(j\omega L11 + \frac{1}{j\omega C11}\right) + V2\left(j\omega L12 + \frac{1}{j\omega C12}\right) = 0 \quad \text{(equation 1)}$$

By dividing both sides of the equation 1 with a square root of a product of V1 and V2, the following equation is obtained.

$$\sqrt{\frac{V1}{V2}}\left(j\omega L11 + \frac{1}{j\omega C11}\right) + \sqrt{\frac{V1}{V2}}\left(j\omega L12 + \frac{1}{j\omega C12}\right) = 0 \quad \text{(equation 2)}$$

If an angular frequency ω of the equation 2 is solved, an antiresonance angular frequency ωp will be obtained. By dividing the antiresonance angular frequency ωp with 2p, the following equation is obtained.

$$fp^2 = \cfrac{1}{(2\pi)^2 \left( \sqrt{\cfrac{V2}{V1}} L11 + \sqrt{\cfrac{V1}{V2}} L12 \right) \cfrac{C11C12}{\sqrt{\cfrac{V1}{V2}} C11 + \sqrt{\cfrac{V2}{V1}} C12}} \quad \text{(equation 3)}$$

The equation 3 is a frequency equation representing the correlation between the antiresonance frequency fp and the voltages V1, V2.

An equivalent circuit of the complex resonator according to the present invention will be intuitively described.

Figure 8A:
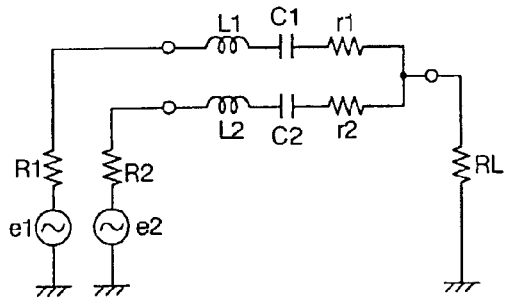
FIG. 8A is a schematic circuit diagram showing an equivalent circuit representing the measuring circuit of FIG. 3.
Figure 8B:
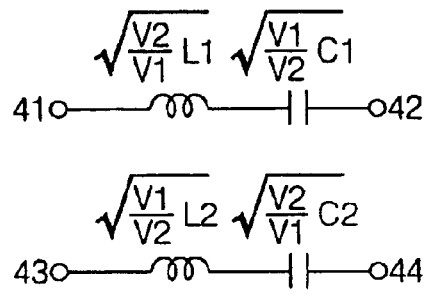
FIG. 8B is a schematic circuit diagram showing an equivalent circuit representing the complex resonance circuit according to the present invention.

In the frequency equation of the equation 3, four equivalent constants are multiplied by a square root of V1 and V2. Therefore, only in order to intuitively understood the antiresonance frequency fp dependence of the complex resonator in response to the voltages V1 and V2, an equivalent circuit shown in FIG. 8B is intuitive and comprehensible. Similar to the equivalent circuit of FIG. 8B, the complex resonator can be also represented as equivalent circuits shown FIGS. 8C and 8D When the measuring circuit of FIG. 3 is represented as an equivalent circuit shown in FIG. 8A, the complex resonator Re1 of FIG. 3 is represented as the equivalent circuit of FIG. 8B. As shown in FIG. 8B, the equivalent circuit is configured by two independent series resonance circuits. When the output voltages of the attenuators ATT1 and ATT2 of FIG. 3 are given by V1 and V2, respectively, equivalence constants of the series resonance circuits are represented as shown in FIG. 8B.

The equivalent constants of the series resonance circuits of FIG. 8B are obtained as follows. An equivalent inductance across the external terminals T1 and T2 is expressed as L1×v(V2/V1) (L1 multiplied by a square root of V2/V1). An equivalent capacitance (capacitor) across the external terminals T1 and T2 is expressed as C1×v(V1/V2). In the same way, an equivalence inductance across the external terminals T3 and T4 is expressed as L2×v(V1/V2). An equivalent capacitance (capacitor) across the external terminals T3 and T4 is expressed as C2×v(V2/V1).

Values of the equivalent inductance L1, the equivalent capacitance C1 (capacitor), the equivalent inductance L2, and the equivalent capacitance C2 (capacitor) is given when the output voltage V1 of the attenuator ATT1 is same as the output voltage V2 of the attenuator ATT2.

In this equivalent circuit, the two series resonance circuits are connected in parallel to each other via the attenuators ATT1 and ATT2. Although two series resonance frequencies of the two series resonance circuits do not depend on the voltages V1 and V2, an antiresonance frequency between these series is varied in response to the voltages V1 and V2. An approximation similar to the equation 3 is given by the following equation.

$$fp^2 = \cfrac{1}{(2\pi)^2 \left( \sqrt{\cfrac{V_2}{V_1}} L_1 + \sqrt{\cfrac{V_1}{V_2}} L_2 \right) \cfrac{C_1 C_2}{\sqrt{\cfrac{V_1}{V_2}} C_1 + \sqrt{\cfrac{V_2}{V_1}} C_2}} \quad \text{(equation 35)}$$

The equation 35 is represented as the equivalent circuits shown in FIGS. 8B, C, and D. The equivalent circuit shown in FIG. 8B has equivalent constants of two series resonance circuits, which constants vary in response to the voltages V1 and V2. An inductance value of the series resonance circuits is inversely proportional to a capacitance value thereof with respect to the voltage V1 and V2 (If one of the inductance value and the capacitance value increases, the other decreases. A product of the inductance value and the capacitance value is constant). Thus, the series resonance frequencies do not changes, which is in agreement with the above-described measurement results.

Figure 8C:
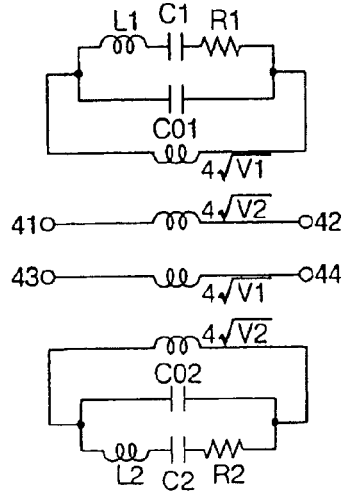
FIG. 8C is a schematic circuit diagram showing an equivalent circuit representing the complex resonance circuit according to the present invention.

The equivalent circuit shown in FIG. 8C is represented on the basis of ratios of transformations of transformers. Variations of an equivalent resistance R1, a parallel capacitor CO1, an equivalent resistance R2, and a parallel capacitor C02 are also represented as shown in FIG. 8C.

Figure 8D:
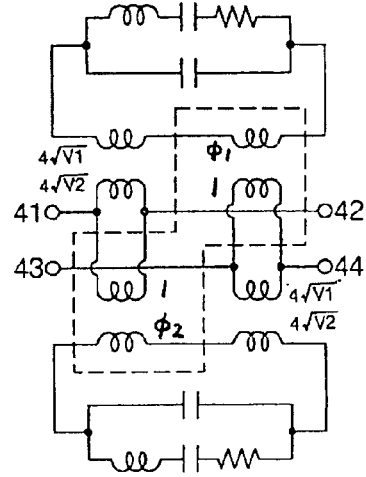
FIG. 8D is a schematic circuit diagram showing an equivalent circuit representing the complex resonance circuit according to the present invention.

In the equivalent circuit shown in FIG. 8D, a circuit which a range of a leakage coupling is represented by ratios f1, f2 of transformations of transformers in the case that shapes and arrangements of the electrodes of the complex resonance circuit shown in FIG. 1 are asymmetric is added to the equivalent circuit shown in FIG. 8C. The additional circuit corresponds to a part enclosed by a dotted line of FIG. 8D. It is understood from FIG. 8D that a dependence of an antiresonance frequency fp in response to the voltages V1 and V2 is defined even if the ratios are 0.5, in other wards, a "leakage coupling" is about 50%.

As described above, in the complex resonator according to the present invention, the antiresonance frequency can vary in response to amplitudes of voltages or currents respectively supplied to two resonance series circuits, and more accurately, in response to a ratio of amplitudes of voltages or currents respectively supplied to two resonance circuits. If an oscillation circuit is configured by using the complex resonator of the present invention, an output frequency of the oscillation circuit will be controlled by adjusting two voltages supplied thereto. If a filter is configured by using the complex resonator of the present invention, a frequency characteristic of the filter such as a passband frequency and a stopband frequency will be controlled by adjusting two voltages supplied thereto.

In addition, the complex resonator of the present invention can be controlled its frequency without a variable-reactance element such as a variable-capacitance diode, which is indispensable for a conventional oscillation circuit. Thus, the complex resonator of the present invention is appropriate for an IC integration.

In the first embodiment, it is described that the antiresonance frequency fp can be equivalently controlled by selecting two natural vibration modes which are excited at natural vibration frequencies adjacent to each other and controlling the vibration modes independently.

The first embodiment of the present invention may be modified as follows. The electrode structure shown in FIG. 1A may be replaced by, for example, an electrode structure shown in FIG. 9. In a second variation of the first embodiment, first and second electrodes formed on a front surface of a piezoelectric substrate are coupled together and fifth and sixth electrodes formed a rear surface are coupled together. The coupled electrodes have the same polarity.

The first embodiment of the present invention may be also modified as follows. A third variation of the first embodiment has an electrode structure in which unnecessary vibrations can be reduced. For reducing the unnecessary vibrations, the electrode structure shown in FIG. 1A is replaced so that the electrodes of FIG. 1A is substantially symmetric in the vertical direction. In the electrode structure of FIG. 1A, the four natural vibration modes shown in FIGS. 2A, 2B, 2C, and 2D can be excited. However, only the two natural vibration modes of FIG. 2B and FIG. 2C are actually utilized in the first embodiment. That is, the natural vibration modes of FIG. 2A and FIG. 2D are unnecessary. If excitations of the unnecessary natural vibration modes are suppressed, spurious resonance peaks will be reduced. For reducing the unnecessary vibrations, the electrode structure of FIG. 1A of the first embodiment may be replaced by an electrode structure shown in FIG. 10.

Figure 10:
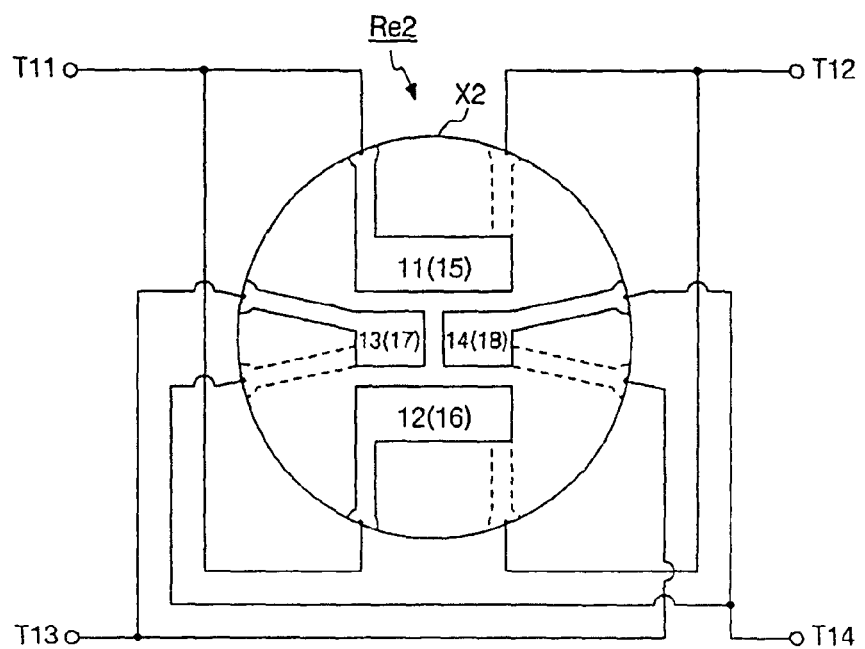
FIG. 10 is a schematic plan view showing a third variation of the first embodiment of the complex resonance circuit according to the present invention.

In the third variation of the first embodiment, a complex resonator Re2 shown in FIG. 10 includes a first electrode 11, a second electrode 12, a third electrode 13, and a fourth electrode 14 which are formed on a front surface of a piezoelectric substrate X2 such as a quartz substrate. The third electrode 13 and the fourth electrode 14 are formed between the first electrode 11 and the second electrode 12. The complex resonator Re2 also includes a fifth electrode 15 opposed to the first electrode, a sixth electrode 16 opposed to the second electrode, a seventh electrode 17 opposed to the third electrode, and an eighth electrode 18 opposed to the fourth electrode, which electrodes are formed on a rear surface of the piezoelectric substrate.

The first and second electrodes 11, 12 have a rectangular shape. The fifth and sixth electrodes 15, 16 have also a rectangular shape. The fifth and sixth electrodes 15, 16 are formed on the rear surface so as to be opposed to the first and second electrodes 11, 12, respectively. The third and fourth electrodes 13, 14, which are formed between the first and second electrodes 11, 12, have a rectangular shape and are separated from each other by a slit. The seventh and eighth electrodes 17, 18 also have a rectangular shape and are separated from each other by a slit. The seventh and eighth electrodes 17, 18 are formed on the rear surface so as to be opposed to the third and fourth electrodes 13, 14, respectively. These electrodes are connected to external terminals, respectively. The first and second electrodes 11, 12 are connected to a first external terminal T11. The fifth and sixth electrodes 15, 16 are connected to a second external terminal T12. The third and eighth electrodes 13, 18 are connected to a third external terminal T13. The fourth and seventh electrodes 14, 17 are connected to a fourth external terminal T14.

In such the electrode configuration, four electrode pairs are disposed on an upper part, a middle part, and a lower part of the piezoelectric substrate X2. The electrodes 11, 15 of the upper part and the electrodes 12, 16 of the lower part are symmetric in shape in the vertical and horizontal directions. The electrodes 11 and 12, both of which are formed on the same surface, are electrically connected to each other so that electric potentials thereat are equal to each other. The electrodes 15 and 16, both of which are formed on the same surface, are also electrically connected to each other so that electric potentials thereat are equal to each other. The electrodes 13, 17 and the electrodes 14, 18 of the middle part are also symmetric in shape in the vertical and horizontal directions. The electrodes 13 and 14, both of which are formed on the same surface, are electrically connected so that electric potentials thereat are different from each other. The electrodes 17 and 18, both of which are formed on the same surface, are also electrically connected so that electric potentials thereat are different from each other. In the electrode structure, the shapes of and the connections of the electrodes are configured so as to be symmetric in the vertical direction, thus natural vibration modes, which are asymmetric in the vertical direction as shown in FIGS. 2B and 2D, are not excited. Therefore, the natural vibration modes as shown in FIG. 2A and FIG. 2C, which are independently excited, appear across the external terminals T11 and T12 and across T13 and T14, respectively. Whereby, the third variation of the first embodiment has a frequency variable characteristic similar to the first embodiment, and in addition, has an effect that a spurious characteristic is suppressed since the unnecessary modes are not excited or drastically suppressed.

The third variation of the first embodiment for suppressing excitations of unnecessary natural vibration modes has been described with reference to FIG. 10. A fourth variation of the first embodiment having electrodes which are also arranged in symmetric with respect to the vertical direction will now be described with reference to FIG. 10. The electrode 11 formed on the upper part of the front surface of the piezoelectric substrate X2 is divided into two electrodes like the two electrodes 13 and 14. The electrode 15 formed on the upper part of the rear surface of the piezoelectric substrate X2 is divided into two electrodes like the two electrodes 17 and 18. The electrodes 12 and 16 of the lower part are respectively divided into two electrodes like the two electrodes 13 and 14 and two electrodes 17 and 18. The electrodes 13 and 14 formed on the center part of the front surface are connected to each other as a common electrode. The electrodes 17 and 18 formed on the center part of the rear surface are connected to each other as a common electrode. In such the electrode configuration, the electrodes are symmetrically arranged in the vertical and horizontal directions. Thus, the electrodes are connected to the external terminals so that only normal vibration modes as shown in FIGS. 2A and 2C are excited. Whereby, the fourth variation of the first embodiment has a frequency variable characteristic similar to the first embodiment, and in addition, has an effect that spurious characteristic is suppressed since the unnecessary modes are not excited or drastically suppressed. Connections between the electrodes and external terminals are omitted since they are connected as shown FIG. 10.

Figure 11A:
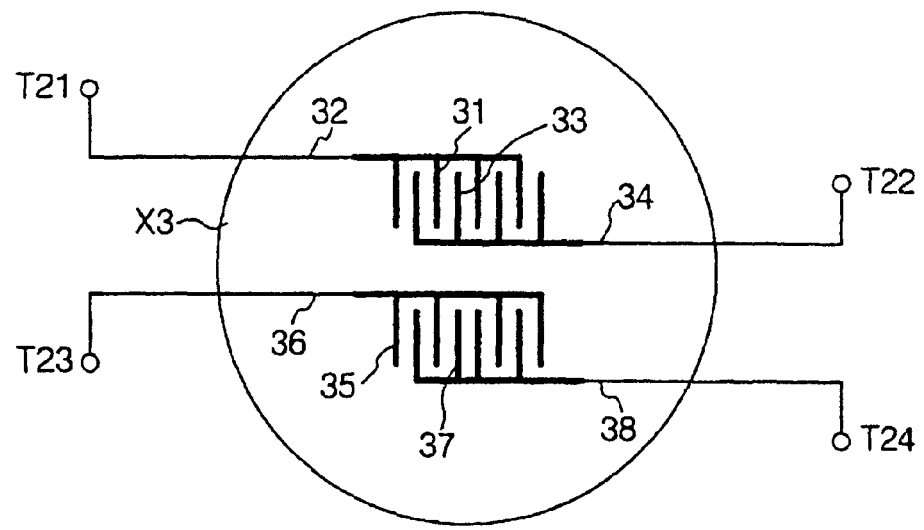
FIG. 11A is a schematic plan view showing a second embodiment of the complex resonance circuit according to the present invention.
Figure 11B:
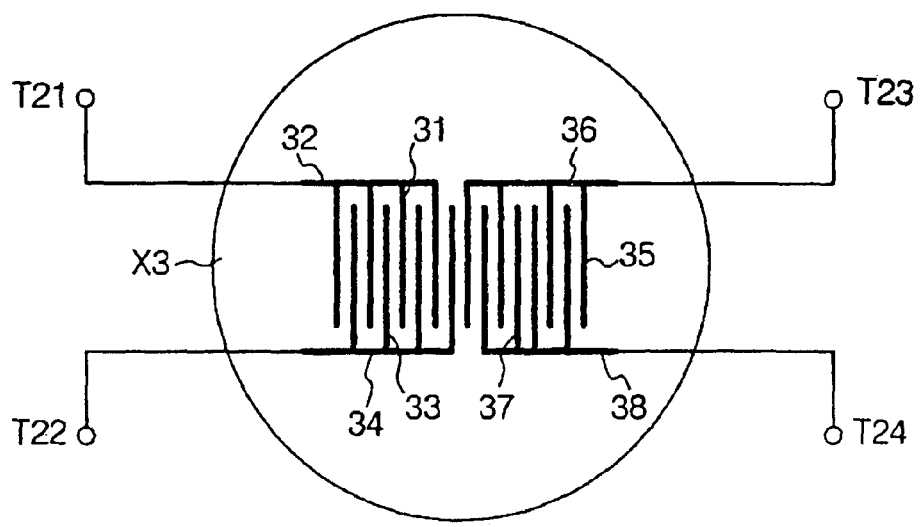
FIG. 11B is a schematic plan view showing a first variation of the second embodiment of the complex resonance circuit according to the present invention.

A second embodiment of the complex resonance circuit according to the present invention will now be described. The second embodiment utilizes Rayleigh surface waves as normal vibration modes. As shown in FIGS. 11A and 11B, the second embodiment has an electrode structure configured by eight interdigital electrode pairs. Similar to a conventional surface wave device, the number of interdigital electrode pairs and the number of bars of the interdigital electrode are increased so that the interdigital electrodes have shapes symmetric to each other.

As shown in FIG. 11A, an interdigital electrode 31 having a plurality of parallel, spaced-apart bars is formed on a piezoelectric substrate X3. The interdigital electrode 31 is connected to a bus bar part 32. An interdigital electrode 33 is formed on the piezoelectric substrate X3 so as to be interdigital with the interdigital electrode 31. The interdigital electrode 33 is connected to a bus bar part 34. The bus bar parts 32 and 34 are connected to external terminals T21 and each T22, respectively. In parallel to a first interdigital electrode pair of 31 and 33, a second interdigital electrode pair of 35 and 37 respectively connected to bus bar parts 36 and 38 is formed. The bus bar parts 36 and 38 are connected to external terminals T23 and T24, respectively.

The plurality of bars of the first interdigital electrode pair formed on an upper part of the piezoelectric substrate X3 is connected so that a periodical electrical potential in phase is applied thereto in the horizontal direction. The plurality of bars of the second interdigital electrode pair formed on an lower part of the piezoelectric substrate X3 is connected so that a periodical electrical potential is applied thereto and a phase of the electrical potential are reverse with respect to a center part thereof. More specifically, in the center of the second interdigital electrode pair, two adjacent bars of the interdigital electrode 37 are connected to the same bus bar part 38. Natural vibration modes excited by AC currents supplied to the external terminals T21 and T22 are as shown in FIGS. 2A and 2B. Natural vibration modes excited by AC currents supplied across the external terminals T23 and T24 are as shown in FIGS. 2C and 2D.

The electrode structure shown in FIG. 1A operates similar to the electrode structure shown in FIG. 1. In the electrode structures shown in FIGS. 1 and 11A, the electrodes formed on the upper part of the piezoelectric substrate are connected to the external electrodes so that voltages having the same phase are applied thereto. On the other hand, the electrodes formed on the lower part of the piezoelectric substrate are connected to the external electrodes so that voltages having different phases are applied thereto.

A first variation of second embodiment will now be described with reference to FIG. 11B. In an electrode structure shown in FIG. 11B, an interdigital electrode pair of 31 and 33 and an interdigital electrode pair of 35 and 37 are serially disposed. Natural vibration modes excited by an AC current supplied across external terminals T23 and T24 are as shown in FIGS. 2E and 2F.

Figure 2E:
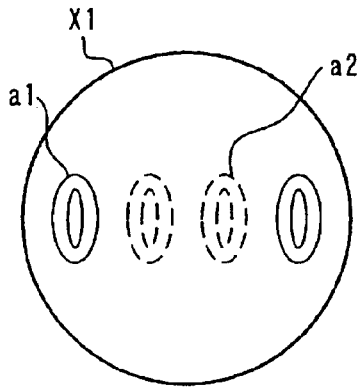
FIG. 2E is a schematic drawing showing a vibration displacement distribution of the complex resonance circuit according to the present invention in a natural vibration mode.
Figure 2F:
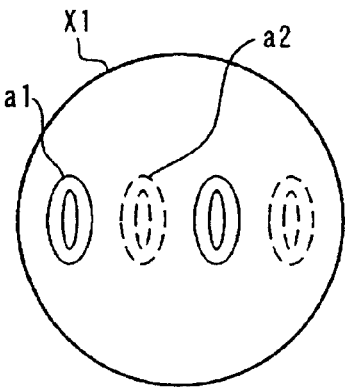
FIG. 2F is a schematic drawing showing a vibration displacement distribution of the complex resonance circuit according to the present invention in a natural vibration mode.

According to the first variation of second embodiment utilizing the natural vibration modes shown in FIGS. 2C and 2E, an antiresonance frequency can be adjusted by changing a driving signal level.

Figure 9:
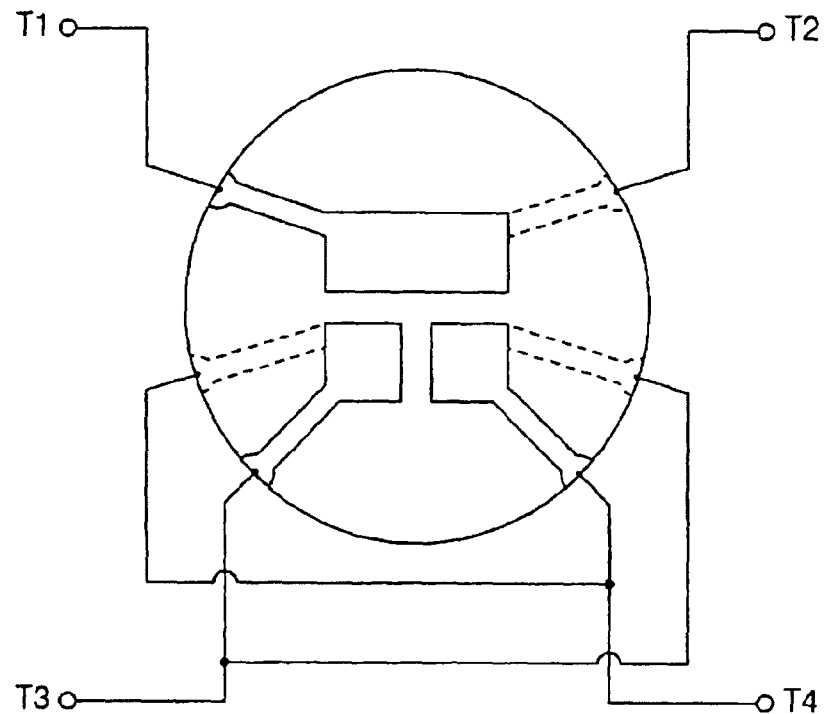
FIG. 9 is a schematic plan view showing a second variation of the first embodiment of the complex resonance circuit according to the present invention.

As shown in FIGS. 1A, 9, and 10, the embodiments having the electrode structures having the electrodes formed on both the front and rear surfaces of the quartz substrate utilizes the bulk wave vibration modes such as a thickness shar vibration. A second variation of the second embodiment of the complex resonance circuit having interdigital electrodes, which also utilizes bulk waves of a thickness shear vibration mode, will now be described with reference to FIGS. 12A, 12B, and 12C. The bulk waves of the thickness shear vibrational modes are excited by applying voltages to the interdigital electrodes.

Figure 12A:
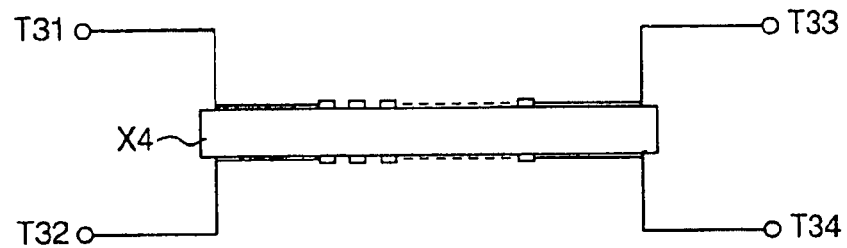
FIG. 12A is a schematic side view showing a second variation of the second embodiment of the complex resonance circuit according to the present invention.
Figure 12B:
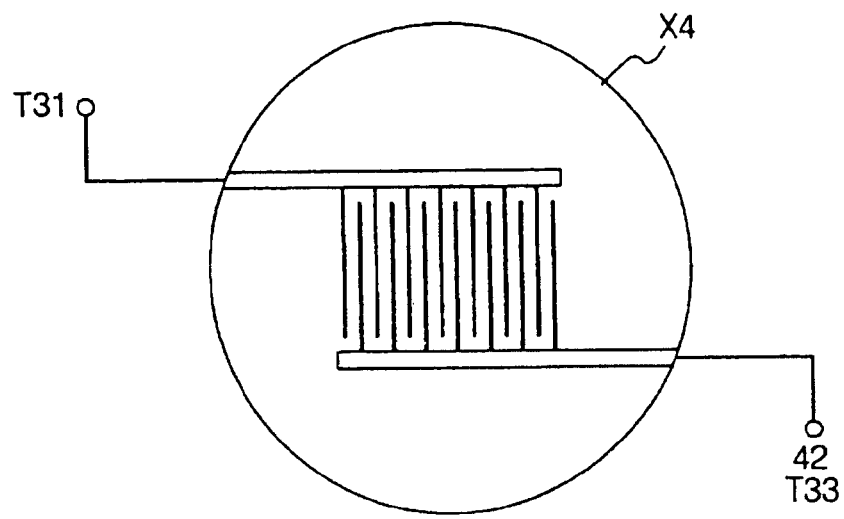
FIG. 12B is a schematic plan view showing the second variation of the second embodiment of the complex resonance circuit according to the present invention.
Figure 12C:
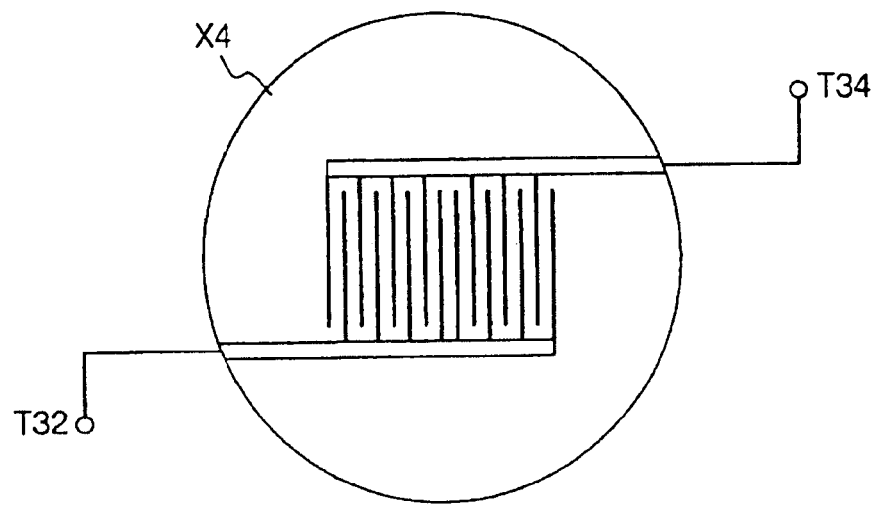
FIG. 12C is a schematic plan view showing the second variation of the second embodiment of the complex resonance circuit according to the present invention.

As shown in FIG. 12A, two interdigital electrodes are formed on a front surface of an At-cut quartz substrate X4. Two interdigital electrodes are formed on a rear surface of the At-cut quartz substrate X4. Each of the interdigital electrodes is configured by a plurality of parallel bars. As shown in FIG. 12B, one interdigital electrode pair formed on the front surface is configured by the two interdigital electrodes which are substantially symmetric to each other in the horizontal direction. As shown in FIG. 12C, the other interdigital electrode pair formed on the rear surface is configured by the electrodes which are horizontally asymmetric in phase to each other with respect to center part thereof.

As shown in FIG. 12B, the two interdigital electrodes on the front surface are substantially symmetric in the horizontal and vertical directions. The bars of the interdigital electrode are connected to the same electric potential. Thus, a vibration displacement of an excited vibration mode is substantially symmetric in the horizontal and vertical directions as shown in FIG. 2A. On the other hands, the bars of the interdigital electrode shown in FIG. 12C are connected to different electric potential at the center of the interdigital electrode. Thus, a vibration displacement of an excited vibration mode is substantially symmetric in the vertical direction and substantially asymmetric in the horizontal direction as shown in FIG. 2C. In the second variation of the second embodiment shown in FIG. 12, unnecessary vibrations as shown in FIGS. 2B and 2D are not substantially excited. The excited natural vibration mode as shown in FIG. 2A appears to external terminals T31 and T33. The excited natural vibration mode as shown in FIG. 2C appears to external terminals T32 and T34. Therefore, the second variation of the second embodiment can suppress spurious vibration modes, and therefore, has a favorable frequency variable characteristic.

The second variation of the second embodiment shown FIGS. 12A, 12B, and 12C may be modified as follows. Periodic interdigital electrodes and periodic groove portions, which are shorted or not shorted, may be disposed on the piezoelectric substrate so as to be adjacent to the interdigital electrodes of FIGS. 12A, 12B, and 12C. The periodic interdigital electrodes and the periodic groove portions are adjacent to each other or uniformly spaced. The periodic interdigital electrodes and the periodic groove portions reflect excited vibrations, thus concentrating vibration energy of the excited vibration into the vicinity of the interdigital electrodes. A property improvement mean such as the periodic interdigital electrodes and periodic groove portions is utilized in a conventional surface wave device (including a filter and a resonator).

A third embodiment of the complex resonance circuit according to the present invention will now be described with reference to FIGS. 13A to 13F. The third embodiment utilizes a bending vibration mode and has electrodes configured by a twin-tuning-fork structure, both ends of which are supported.

Figure 13A:
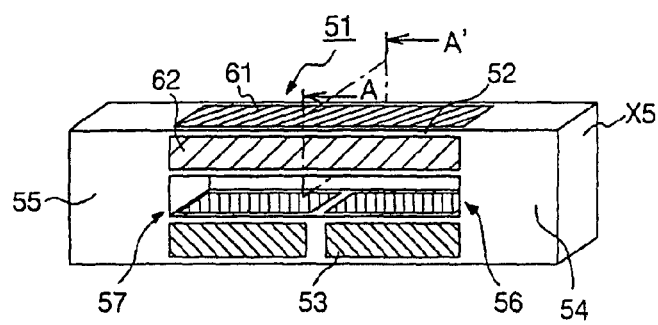
FIG. 13A is a schematic perspective view showing a third embodiment of the complex resonance circuit according to the present invention.

FIG. 13A is a perspective view showing a X-cut quartz substrate having a twin-tuning-fork structure, both ends of which are supported. The quartz substrate shown in FIG. 13A has a structure similar to a conventional piezoelectric vibrator utilizing a twin-tuning-fork structure and a bending vibration mode. Firstly, components similar to the conventional piezoelectric vibrator are schematically described for the sake of simplicity.

As shown in FIG. 13A, a quartz substrate 51 with a uniform thickness has a rectangular shape. A rectangular aperture is formed so as to pass completely through a center of the quartz substrate 51. The quartz substrate 51 includes upper and lower parts 52 and 53, right and left ends 54 and 55, and right and left bifurcation parts 56 and 57.

Figure 13B:
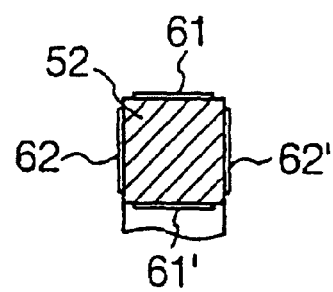
FIG. 13B is a schematic cross-sectional view showing the third embodiment taken along A-A' line of FIG. 13A.
Figure 13C:
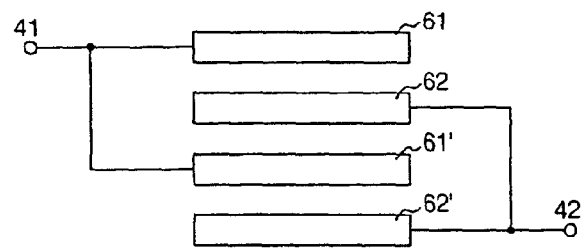
FIG. 13C is a schematic view showing four electrodes of an upper part of a twin-tuning fork structure of the third embodiment.

Next, an arrangement and a connection of electrodes formed on the quartz substrate 51 will now be described. As shown in FIG. 13B which is a cross-sectional view showing one part of the quartz substrate 51 taken along the A-A' line of FIG. 13A, electrodes 61, 61', 62, and 62' are respectively formed on four surfaces of the upper part 52. The electrodes 61, 61', 62, and 62' are connected as shown in FIG. 13C which is a projected diagram of the electrodes. In other wards, the four electrodes 61, 61', 62, and 62' connected as shown in FIG. 13C is respectively formed on four surfaces of the upper part 52. In FIG. 13A, the electrodes 61 and 62 are illustrated, but the electrodes 61' and 62' are hidden behind the upper part 52.

A conventional tuning-fork type bending resonator is formed by forming four electrodes on four surfaces of the lower part 53 of the quartz substrate 51. It is known that the conventional tuning-fork type bending resonator vibrates around at a resonance frequency in a vertical direction of FIG.

Figure 13E:
FIG. 13E is a schematic drawing showing a vibration displacement of the upper part of the twin-tuning fork structure of the third embodiment.

13A in response to AC voltages applied to two external electrodes connected thereto. The vibration motion of the conventional tuning-fork type bending resonator in the vertical direction is similar to a vibration motion of a string in a vertical direction. A mode shape of the vibration displacement at the upper part 52 is shown in FIG. 13E. As shown in FIG. 13E, the vibration displacement has the highest point at a center portion of the upper part 52 and the smallest points at both ends of the upper part 52, in other wards, at the right and left bifurcation parts 56 and 57.

On the other hand, an absolute value of a vibration displacement of the lower part 53 is similar to that of the upper part 52, but a direction of the vibration displacement of the lower part 53 is opposed to that of the upper part 52. Thus, a mode shape of the vibration displacement of the lower part 53 is an inversion of the curvature of FIG. 13E.

Figure 13D:
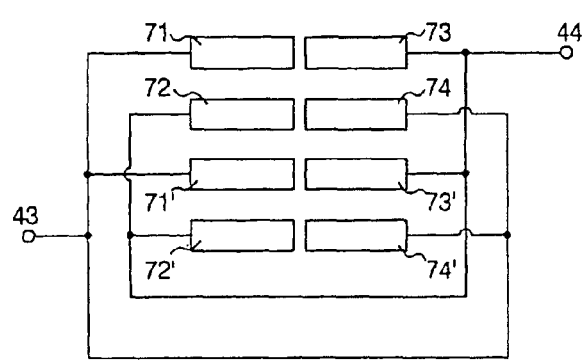
FIG. 13D is a schematic view showing eight electrodes of a lower part of the twin-tuning fork structure of the third embodiment.

In the third embodiment of the present invention, the electrodes 61, 61', 62, and 62' are formed on the four surfaces of the upper part 52 as shown in FIGS. 13B and 13C and connected as shown in FIG. 13C. In addition, electrodes separated at a center of the lower part 53 are formed as shown in FIG. 13D. The electrodes of the lower part 53 are different from the conventional tuning-fork type bending resonator.

As shown in FIG. 13D, eight electrodes 71 to 74 and 71' to 74' are formed on the lower part 53. The configuration of the eight electrodes will now be described from a view point of operations thereof. The third embodiment of the present invention includes the twin-tuning fork structure in which four electrodes shown in FIG. 13C are respectively formed on four surfaces of the upper part 52 and eight electrodes shown in FIG. 13D are formed on four surfaces of the lower part 53. The four electrodes of the upper part 52 are connected to the external electrodes 41 and 42 as shown in FIG. 13C. The eight electrodes of the lower part 53 are connected to the external electrodes T43 and T44 as shown in FIG. 13D.

It is known that AC voltages applied to the external terminals 41 and 42 produce a vertical vibration around at a resonance frequency in the upper part 52 of the quartz substrate 51 of FIG. 13A. The vibration motion of the upper part 52 is similar to a vertical vibration motion of a string. A vibration displacement of the upper part 52 in response to the AC applied voltages shows a mode shape as shown in FIG. 13E. The upper part finger 52 has the largest vibration displacement at the center thereof and the smallest vibration displacement at both ends thereof, in other wards, around at the right and left bifurcation parts 56 and 57. Vibration energy of the upper part 52 is propagated into the lower part 53 via the right and left bifurcation parts 56 and 57, thus causing a vibration of the lower part 53 whose amplitude is similar to that of the upper part 52 and vibration direction is opposed to that of the upper part 52.

Figure 13F:
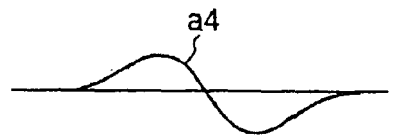
FIG. 13F is a schematic drawing showing a vibration displacement of the lower part of the twin-tuning fork structure of the third embodiment.

On the other hand, it is also known that an AC voltage applied across the external terminals 43 and 44 produce a vertical vibration around at a resonance frequency in the lower part 53 of the quartz substrate 51 of FIG. 13A. The vibration motion of the lower part 53 is similar to a vertical vibration motion of a string. A vibration displacement of the lower part 53 in response to the AC applied voltages shows a mode shape as shown in FIG. 13F. The lower part 53 has the largest vibration displacement at intermediate points between a center thereof and both ends thereof and the smallest vibration displacement at the center thereof and at both ends thereof, in other wards, around at the right and left bifurcation parts 56 and 57. Vibration energy of the upper part 52 is propagated into the lower part 53 via the right and left bifurcation parts 56 and 57, thus causing a vibration of the upper part 52 whose amplitude is similar to that of the lower part 53 and direction is opposed to that of the lower part 53. As shown in FIG. 13D, the electrodes of the lower part 53 are isolated into two electrode groups, one of which includes the electrodes 71, 72, 71', and 72' and the other of which includes the electrodes 73, 74, 73', and 74'. This is because the AC voltages having different polarities are applied to the two electrode group, respectively, as shown in FIG. 13D.

In the case that the AC voltage is applied across the external terminals 43 and 44, vibration energy of the lower part 53 is transferred into the upper part 52 via the right and left bifurcation parts 56 and 57, thus causing a vibration of the upper part 52 whose amplitude is similar to that of the lower part 53 and direction is opposed to that of the lower part 53. A mode shape of the vibration displacement of the upper part 52 is an inversion of the curvature of FIG. 13F.

As described above, both of two natural vibration modes entirely appear in the twin-tuning-fork type resonator of the present invention. In a similar way of the first embodiment, an antiresonance frequency of the twin-tuning-fork type resonator can be controlled by adjusting amplitudes of signals respectively applied to the upper and lower parts.

The first to third embodiments of the complex resonance circuit according to the present invention have been described. These embodiments utilize two natural vibration modes of a thickness shear vibration, a surface wave vibration, and a tuning fork longitudinal vibration.

However, the complex resonance circuit according to the present invention is not limited to the first to third embodiments. The complex resonance circuit according to the present invention can be modified into another embodiment utilizing a piezoelectric vibrator which can excite a bending vibration, a longitudinal vibration, a face shear vibration, a width-extensional vibration, a thickness shear vibration, a thickness longitudinal vibration, a shear horizontal surface wave vibration, a SMR vibration, or a Stoneley surface wave. The complex resonance circuit according to the present invention includes two electrode pairs for independently driving at least two natural vibration modes of a piezoelectric vibrator. The at least two natural vibration modes are selected among a large number of natural vibration modes. Thus, the complex resonance circuit according to the present invention can eliminate a variable-reactance element and adjust a frequency by controlling a difference between two driving voltages respectively applied to the two electrode pairs.

The complex resonance circuit according to the present invention utilizing a piezoelectric material is summarized as follows. Arrangements and shapes of electrodes formed on a piezoelectric substrate are configured so as to be substantially symmetric in the horizontal and vertical direction. A first pair of the electrodes connected to the same polarity and a second pair of the electrodes whose polarities are opposite to each other with respect to a center thereof are disposed. In other words, two electrode pairs for effectively concentration electric charges originated from two natural vibration modes are disposed. Each of the electrodes is configured so that the electric charges are applied.

Therefore, the complex resonance circuit according to the present invention is configured so that a plurality of electrodes are formed on the same piezoelectric substrate and two exited natural vibration modes are independently controlled.

First to sixth embodiments of the oscillation circuit according to the present invention will now be described. The first to sixth embodiments utilize the complex resonator according to the present invention.

The first embodiment of the oscillation circuit according to the present invention, which is configured so as to adjust an oscillation frequency over a wide range around at an antiresonance frequency by controlling voltages applied to two external terminals, is firstly described.

A conventional oscillation circuit oscillates around at a "resonance frequency", whereas the oscillation circuit according to the present invention oscillates at an "antiresonance frequency" since the complex resonator according to the present invention essentially operates so as to adjust an antiresonance frequency.

For the sake of oscillating a shunt circuit around at an antiresonance frequency, the oscillation circuit of the present invention is configured by T-shaped circuits connected to an amplifier. Each of the T-shaped circuits is configured by a series arm and a shunt arm. The series arm has two capacitors. The shunt arm is connected to the complex resonance circuit of the present invention. The oscillation circuit according to the present invention is completely different from a conventional oscillation circuit configured by n-shaped circuit connected to an amplifier. In the conventional oscillation circuit, a series arm is connected to a quartz oscillator and a shunt arm has two capacitors.

Figure 14A:
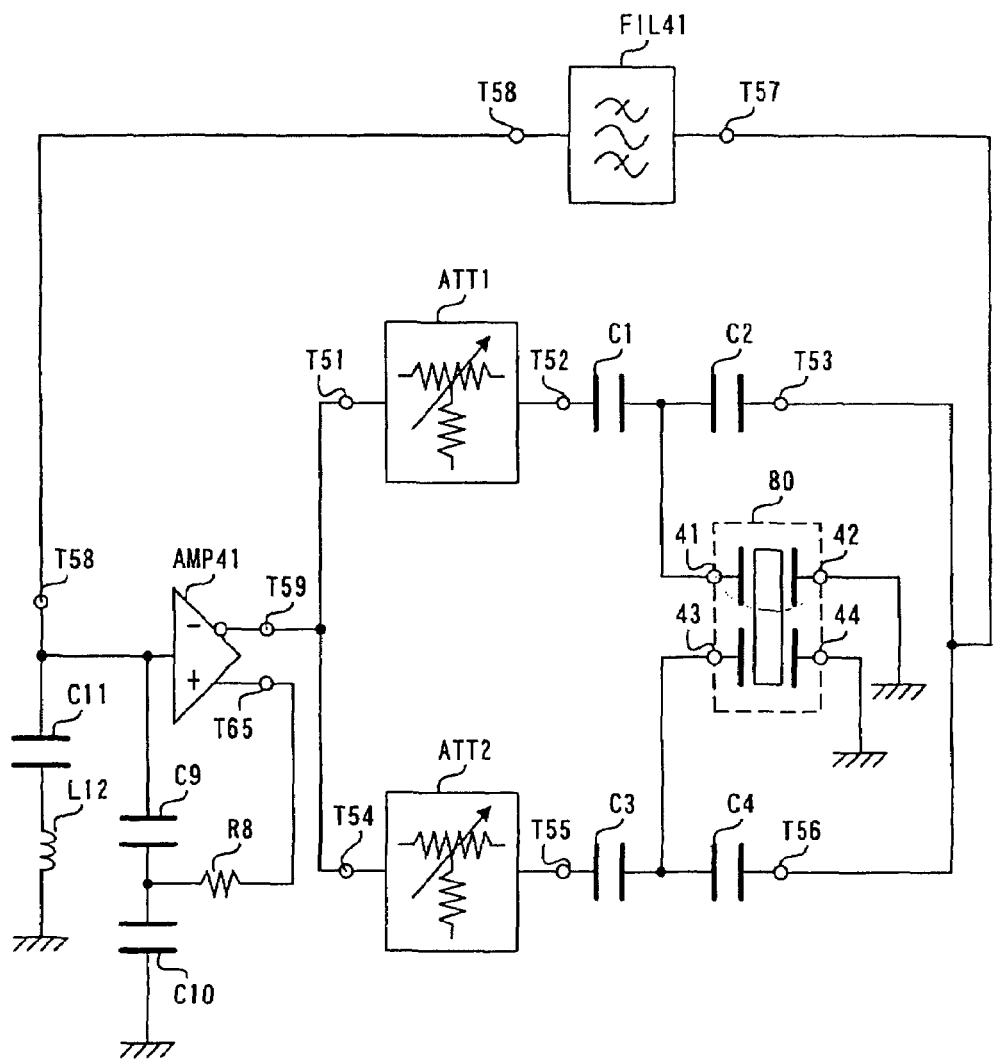
FIG. 14A is a schematic circuit diagram showing a first embodiment of a oscillation circuit according to the present invention.

FIG. 14A is a block diagram showing a first embodiment of the oscillation circuit according to the present invention. The first embodiment includes the complex resonator according to the present invention. A part 80 enclosed by a dotted line corresponds to the complex resonator (hereafter "piezoelectric vibrator") according to the present invention which is schematically illustrated. External terminals T41, T42, T43, and T44 are similar to the external terminals of the embodiments of the complex resonance circuit according to the present invention which have already been described. The external terminals T42 and T44 of the piezoelectric vibrator 80 are grounded. The external terminals T41 is connected to an attenuator ATT41 and two capacitors C1 and C2. The external terminals T43 is connected to an attenuator ATT41 and two capacitors C3 and C4.

An amplifier AMP41, which is configured by at least one conventional transistor or at least one complex circuit having at least one conventional transistor, includes an input terminal T58, an output terminal T59 whose output phase is opposed to an input phase of the input terminal T58, and an output terminal T65 whose output phase is same as the input phase of the input terminal T58.

The antiphase output terminal T59 of the amplifier AMP41 is divaricated into terminals T51 and T54 which are connected to four capacitors C1 to C4 and the piezoelectric vibrator 80 via the attenuators ATT41 and ATT42, respectively. The terminals T51 and T54 are also connected to an intermediate tap T57. The oscillation circuit shown in FIG. 14A is configured by a negative feedback loop circuit of the amplifier AMP41.

The negative feedback circuit loop corresponds to a negative feedback path connecting from the output terminal of the amplifier to the input terminal. A path connecting from the output terminal T59 to the intermediate tap T57 configures a power distribution circuit. The power distribution circuit includes two power distribution paths, one of which is configured by a path connecting from the intermediated tap T51 to the intermediate tap T57 and the other of which is configured by a path connecting from the intermediated tap T54 to the intermediate tap T57. In addition, in the two electric power supply paths, a first electric current branch path is configured by two paths: a path over the intermediate taps T52→T53→T57 and a path over the intermediate taps T55→T56→T57. A second electric current branch path is configured by two paths: a path connecting from a middle point between the intermediated taps T52, T53 to the earth potential via the piezoelectric vibrator 80 and a path connecting from a middle point between the intermediated taps T55, T56 to the earth potential via the piezoelectric vibrator 80.

One end of a series circuit having a capacitor C11 and a coil L12 is connected to the input terminal T58 of the amplifier AMP41 and the other end of the series circuit is grounded. One end of a series circuit having capacitors C9 and C10 is connected to the input terminal T58 and the other end of the series circuit is grounded. A circuit loop connecting from a middle point between capacitors C9, C10 to the output terminal T65 via a resistance R8 is configured. This circuit loop corresponds to a positive feedback circuit loop of the amplifier AMP41.

The negative feedback circuit loop configures a negative feedback path connecting from the output terminal of the amplifier to the input terminal.

Even if a value of the resistance R8 is 0, that is, the resistance R8 is shorted, the amplifier AMP41 substantially operates, which is similar to a conventional oscillation circuit.

A function of the positive-feedback circuit loop will now be described. A circuit including the input terminal T58 of amplifier AMP41, the output terminal T65, the coil L12, the capacitors C11, C9, C10, and the resistance R8, configures a conventional Colpitts oscillator (Clapp oscillator). Element values of the circuit are arbitrarily configured, and if a gain of the amplifier AMP41 has a sufficient value, the oscillation circuit will start and maintain its oscillation.

And, an oscillation frequency in this case is approximately a resonance frequency of a synthesis capacity of a series connection having the coil L12 and three capacitors C11, C9, and C10. In the first embodiment, an oscillation frequency around at an antiresonance frequency generated by the complex resonance circuit including the piezoelectric vibrator 80 is selected.

The capacitor C11 has a DC voltage cutoff function so that a DC bias voltage having a proper amplitude is applied to the amplifier AMP41.

The amplifier AMP41 and a band-pass filter FIL41 are configured so as to have amplification gains sufficient for compensating a loss in the oscillation of the entire oscillation circuit, and thus the piezoelectric vibrator 80 excites an antiresonance frequency. The amplifier AMP41 and the band-pass filter FIL41 have such a phase characteristic that the piezoelectric vibrator 80 oscillates around at an antiresonance frequency. The amplifier AMP41 and the band-pass filter FIL41 may have a function, for instance, an AGC mechanism, so as to hold an output level at an output end (the intermediate tap 59) of the amplifier AMP41 constant.

A principle of the oscillation circuit according to the present invention will now be described. The oscillation circuit oscillates around at an antiresonance frequency of the complex resonance circuit according to the present invention. Since an upper half part having the intermediate taps 52, 53 and the external terminals T41, T42 of the piezoelectric vibrator 80 is configured similar to a lower half part having the intermediate taps 55, 56 and the external terminals T43, T44 of the piezoelectric vibrator 80, only the upper half part is described.

Figure 15:
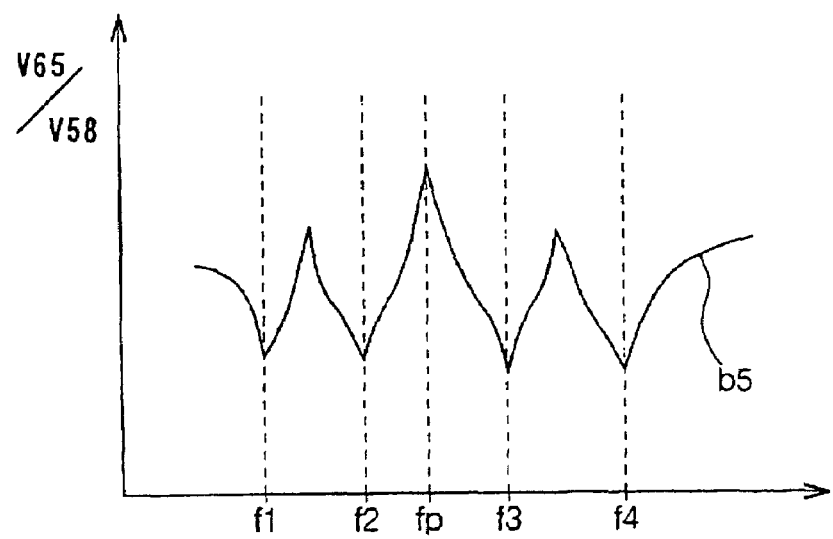
FIG. 15 is a graph showing frequency characteristic curve for the first embodiment of the oscillation circuit according to the present invention.

The upper part having the intermediate taps 52, 53 and the external terminals T41, T42 of the piezoelectric vibrator 80 configures a T-shaped circuit. That is, the T-shaped circuit is configured by two parts: one of which is a shunt arm connected to the external terminals T41 and T42 of the piezoelectric vibrator 80 and the other of which is a series arm connected to the two capacitors C1 and C2. The negative feedback circuit is configured by two T-shaped circuits, thus allowing for an effect similar to an impedance inverting function as shown in FIG. 15. The effect is accompanied by the amplification gain the amplifier AMP41.

The negative feedback circuit is configured by two T-shaped circuits, thus a frequency characteristic curve b5 shown in FIG. 15 which is vertically reversed to the frequency characteristic curve b3 of FIG. 5 is observed. The vertical axis of FIG. 15 corresponds to an applied voltage at the intermediate tap 65 which is divided by an applied voltage at the intermediate tap 58. The horizontal axis of FIG. 15 corresponds to a frequency.

The frequency characteristic curve b5 of FIG. 15, which is vertically reversed to the frequency characteristic curve b3 of FIG. 5, is observed. Thus, it is apparently understood that an antiresonance frequency of the piezoelectric vibrator of the present invention is viewed as a resonance frequency of a conventional piezoelectric vibrator. Therefore, the oscillation circuit can be configured by the positive and negative feedback circuits including the T-shaped circuits and the amplifier having a predetermined frequency characteristic.

Next, a method of continuously adjusting a frequency by changing voltages applied to two external terminals of the piezoelectric vibrator will now be described. As described above, when the voltages respectively applied to the external terminals T41 and T43 of the piezoelectric vibrator according to the present invention are changed, an antiresonance frequency fp is adjusted as shown in FIG. 6. In the oscillation circuit shown in FIG. 14A, an adjustment of the antiresonance frequency fp is performed by adjusting a difference in attenuation values between two attenuators: one of which is ATT41 between the intermediate taps 51 and 52 and the other of which is the attenuator ATT42 between center the intermediate taps 54 and 55.

A power output of the amplifier at the intermediate tap 51 is attenuated by the attenuator ATT41 so that a sufficient voltage is applied thereto. And then, the voltage is applied to the external terminal T41 of the piezoelectric vibrator via the capacitor C1. By arbitrarily adjusting an attenuation value of the attenuator ATT41, the applied voltage on the external terminal T41 can be arbitrarily controlled. In the same way, an applied voltage on the external terminal T43 can be arbitrarily controlled by arbitrarily adjusting an attenuation value of the attenuator ATT42.

By controlling each attenuation value of the two attenuators ATT41 and ATT42, the applied voltages on the external terminals T41 and T43 can be arbitrarily adjusted. Therefore, a value of an antiresonance frequency fp can be arbitrarily adjusted as shown in FIG. 6.

Even if the four capacitors C1 to C4 are replaced by four coils, four resistances, or combinations of capacitors, coils, and resistances, a similar effect will be obtained. An output impedance of a commercial attenuator is 50 O. Output impedances of the attenuators ATT41 and ATT42 of the first embodiment are not limited to this value. When the output impedances of the attenuators ATT41 and ATT42 are extremely small, for example, no less than 1 O, the attenuators ATT41 and ATT42 show preferable characteristics. In addition, if the attenuators ATT41 and ATT42 are replaced by resistance attenuators, each of which has an internal element including a resistance, a similar effect will be obtained. And even if the attenuators ATT41 and ATT42 are replaced by attenuators, each of which has a reactance element including a capacitor and a coil, a similar effect will be obtained.

The first embodiment of the oscillation circuit of the present invention operates around at an antiresonance frequency fp of the piezoelectric vibrator 80. Since the piezoelectric vibrator shows a high impedance characteristic around at the antiresonance frequency, it is required to pay attention to a variation of a stray capacity generated around the piezoelectric vibrator at the time when the oscillation circuit is packaged. For the sake of reducing an influence of the stray capacity and producing an easy-to-use oscillation circuit, it is preferable that circuit elements including, for example, the intermediate taps 52, 53, 55, and 56, the four capacitors C1 to C4, and the piezoelectric vibrator 80 of FIG. 14A are packaged in the same cage. And thus, the influence of the variation of the stray capacity will be reduced by an overcoated part in the cage. As described above, four capacitors C1 to C4 may be replaced by four coils, four resistances, or the combinations of coils, capacitors, and resistances.

Figure 14B:
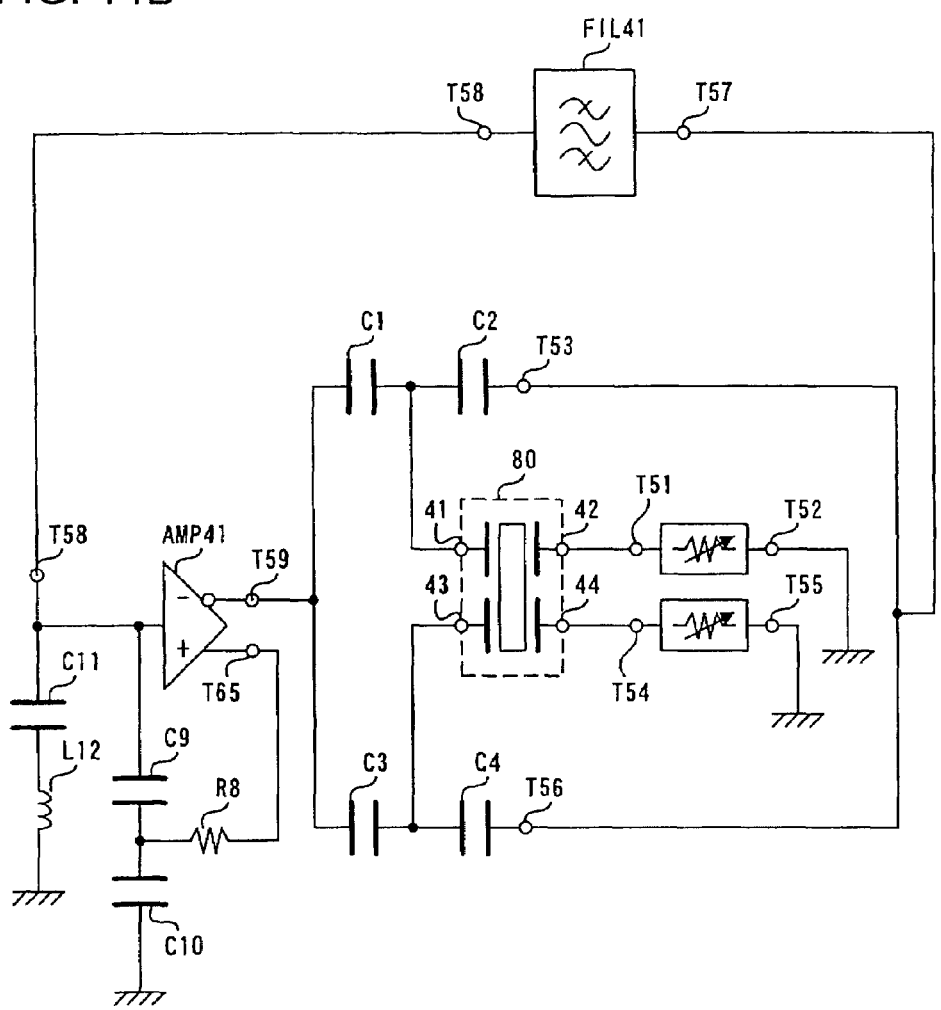
FIG. 14B is a schematic circuit diagram showing a variation of the first embodiment of the oscillation circuit according to the present invention.

A variation of the second embodiment of the oscillation circuit will now be described with reference to FIG. 14B. The oscillation circuit shown in FIG. 14A is modified into an oscillation circuit shown in FIG. 14B as follows.

First of all, the attenuator ATT41 of FIG. 14A is removed, and then the intermediate tap T51 and T52 are shorted to each other. Similarly, the attenuator ATT42 is removed, and then the intermediate tap T54 and T55 are shorted to each other. The removed attenuator ATT41 is connected between the external terminal 42 and the earth potential of the piezoelectric vibrator 80. Similarly, the removed attenuator ATT2 is connected between the external terminal 44 and the earth potential of the piezoelectric vibrator 80. In such a circuit structure as shown in FIG. 14B, attenuation values of the attenuators ATT1 and ATT2 are controlled, so that electric potential differences between the external terminals 41 and 42 of the piezoelectric vibrator 80 and between the external terminals 43 and 44 can be changed. Thus, an antiresonance frequency of the piezoelectric vibrator 80 can be adjusted.

Figure 16:
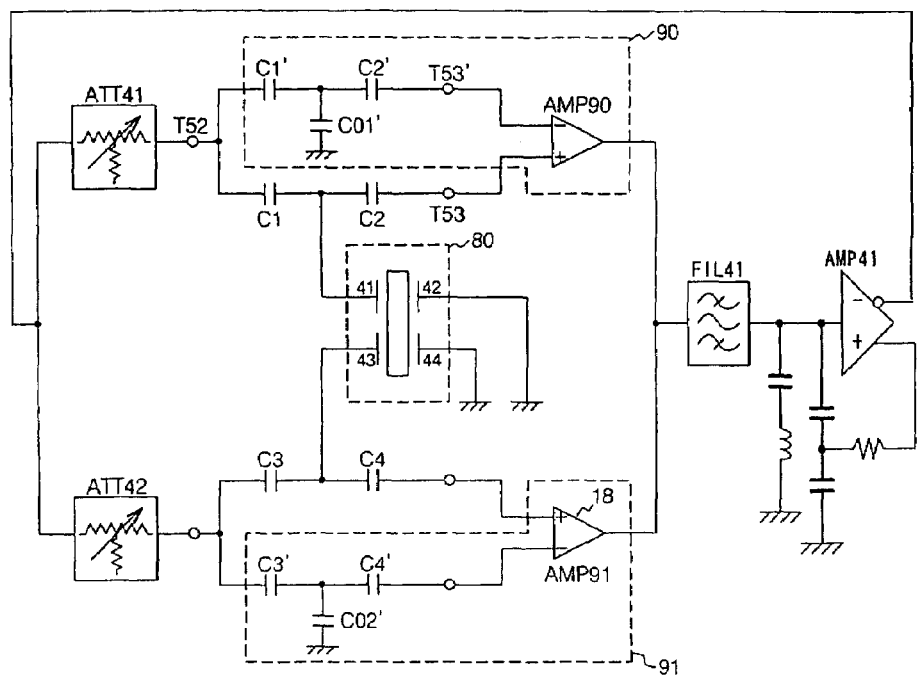
FIG. 16 is a schematic circuit diagram showing a second embodiment of the oscillation circuit according to the present invention.

Next, a second embodiment of the oscillation circuit according to the present invention for cancelling parallel capacities of a piezoelectric vibrator will now be described with reference to FIG. 16. FIG. 16 is a schematic circuit diagram showing the second embodiment of the oscillation circuit according to the present invention. As shown in FIG. 16, the second embodiment is configured so that circuits 90 and 91 enclosed by dotted lines are added to the circuit of FIG. 14A. Since both of the additional circuits have the same components and functions, only the circuit 90 will be described.

The circuit 90 includes capacitors C1', C2', and CO1' and a differential amplifier AMP90. It is configured that the two capacitors C1' and C2' have the same capacitance value as that of capacitors C1 and C2. It is also configured that a capacitance value of the capacitor CO1' is same as that of a parallel capacity CO1 connected between the external terminals T41 and T42 of the piezoelectric vibrator 80. Power outputs of the capacitor C2 and the capacitor C2' are connected to positive and negative input terminals of the differential amplifier AMP90 via an intermediate tap T53 and T53', respectively.

In the second embodiment, the parallel capacity CO1 between the external terminals T41 and T42 of the piezoelectric vibrator 80 can be cancelled by a bridge balance phenomenon. In the same way, a parallel capacity CO2 between the external terminals T43 and T44 can be canceled by the circuit 91 enclosed by the dotted line of FIG. 16.

A third embodiment of the oscillation circuit according to the present invention for cancelling parallel capacities of a piezoelectric vibrator in a different way will now be described with reference to FIG. 22A.

Figure 22A:
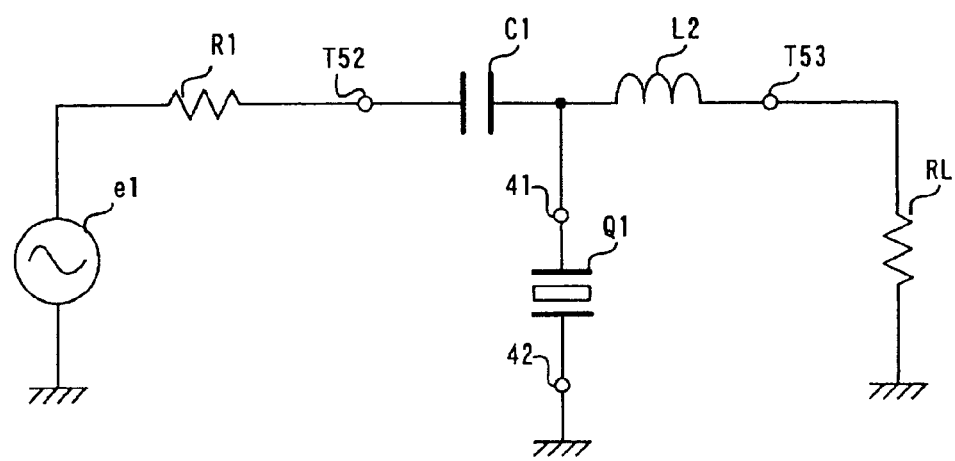
FIG. 22A is a schematic circuit diagram showing a third embodiment of the oscillation circuit according to the present invention for cancelling parallel capacities.

As shown FIG. 22A, the third embodiment of the oscillation circuit according to the present invention includes a T-shaped circuit across an AC power source e1 and a load resistance RL. A conventional piezoelectric vibrator Q1 is connected to a middle point of a series arm having a capacitor C1 and a coil L2.

The piezoelectric vibrator Q1 in the circuit of FIG. 22A is formed from a HC-49/U type AT-cut quartz resonator whose resonance frequency is 9.9952 MHz. A design of and a specification of the piezoelectric vibrator is the same as those described above. A nominal capacitance value of the capacitor C1 is 2.5 pF and a nominal inductance value of the coil L2 is 27 µH.

Configuration conditions of circuit element constants of the T-shaped circuit of FIG. 22A will now be described with reference to FIG. 22B.

When a capacitance value of the parallel capacity of the piezoelectric vibrator Q1 is given by CO1, it is configured that a sum (CO1+C1) of the capacitance value of the parallel capacity CO1 and the capacitance value of the capacitor C1 is in the range of an operation frequency bandwidth (an oscillation frequency bandwidth). It is also configured that a resonance frequency determined from an inductance value of the coil L2 is in the range of the operation frequency bandwidth (the oscillation frequency bandwidth). When the capacitance values of the CO1 and the C1 are relatively small, it is possible to experimentally reconfigure the capacitance values and the resonance frequency in consideration of an influence of the stray capacity.

Figure 23:
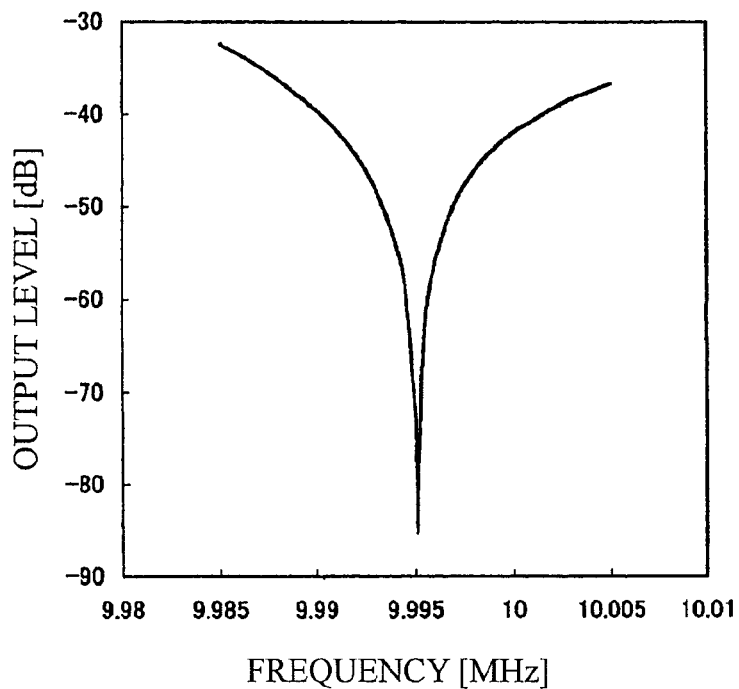
FIG. 23 is a graph showing experimental frequency characteristics for the third embodiment of the oscillation circuit according to the present invention.

FIG. 23 is a graph showing an experimental frequency characteristic curve for the third embodiment shown in FIG. 22A. The horizontal axis of FIG. 23 corresponds to a frequency, and the vertical axis corresponds to an absolute value of an attenuation value. It is understood from FIG. 23 that the experimental frequency characteristic curve is symmetric with respect to the frequency and that the influence of the parallel capacity is reduced and substantially cancelled. Since the attenuation value shown in FIG. 23 has a maximum point at a frequency 9.9952 MHz which corresponds to a resonance frequency of the piezoelectric vibrator Q1, it is understood that an impedance inversion effect is also generated.

It is to be noted that a position of the coil is modified in the series arm. The position of the coil of FIG. 22A is modified as shown in FIG. 22C. As shown in FIG. 22C, even if a coil L1 is positioned at a position where the capacitor C1 of FIG. 22B is disposed and a capacitor C2 is positioned at a position where the coil L2 of FIG. 22B is disposed, a similar effect will be obtained.

One of the circuit element constants of the T-shaped circuit, which has not been described, will now be described. According to the present invention, the one of circuit element constants of the T-shaped circuit is utilized for optimizing an effective Q-value (an effective sharpness of the peak resonance) of the piezoelectric vibrator Q1 (the complex resonator according to the present invention) so that the effective Q-value is not degraded around at an antiresonance frequency. Configuration conditions of the optimized circuit constants are as follows.

Figure 22B:
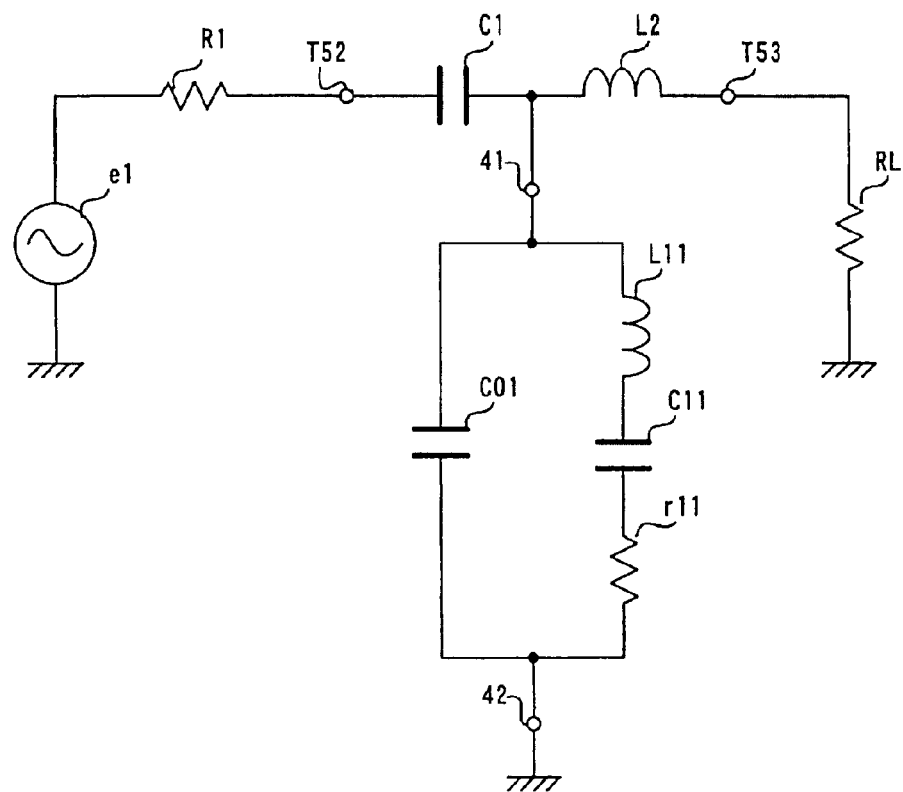
FIG. 22B is a schematic circuit diagram showing an equivalent circuit representing the third embodiment of the oscillation circuit according to the present invention for cancelling parallel capacities.
Figure 22C:
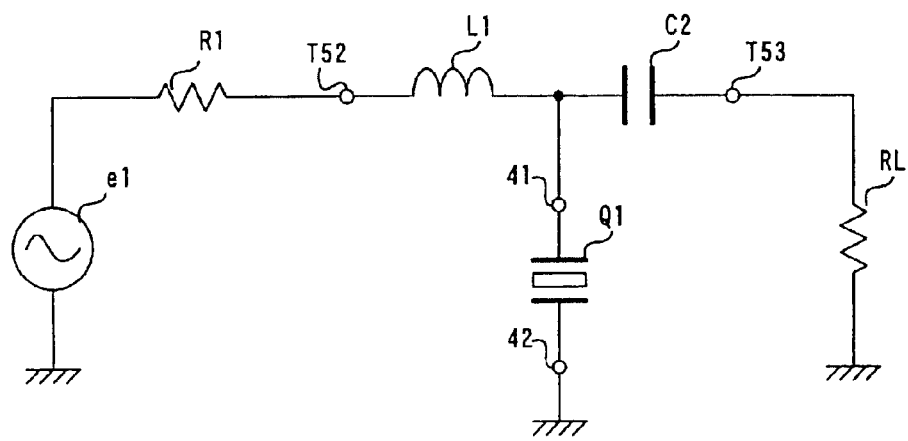
FIG. 22C is a schematic circuit diagram showing a variation of the third embodiment of the oscillation circuit according to the present invention for cancelling parallel capacities.

In FIG. 22B, it is firstly configured that a capacitance value of the capacitor C1 connected to a series arm is ten times or less than a capacitance value of the parallel capacity CO1. It is configured that the parallel capacity CO1 of FIG. 22B is the parallel capacity CO1 of the piezoelectric vibrator Q1 of FIG. 22A. Under such the configuration condition of the circuit element constants, a resonance impedance value of a resonance part including the capacitor C1 and the coil L2 of the T-shaped circuit becomes a sufficient large value, so that the piezoelectric vibrator Q1 connected to a shunt arm remarkably exhibits an impedance shunt effect.

In the circuit of FIG. 22B, it is experimentally confirmed that the parallel capacity cancelling effect and the impedance inversion effect are obtained under the following condition. It is configured that a resonance frequency which is determined from the sum (CO1+C1) of the capacitance values of the parallel capacity CO1 of the quartz resonator Q1 and the capacitance value of the capacitor C1 is within the range of a working frequency bandwidth. In addition, it is configured that the inductance value of the coil L2 is in the range of the working frequency bandwidth. This behavior is theoretically analyzed with reference to a circuit shown in FIG. 24A which is an equivalent circuit of FIG. 22B.

Figure 24A:
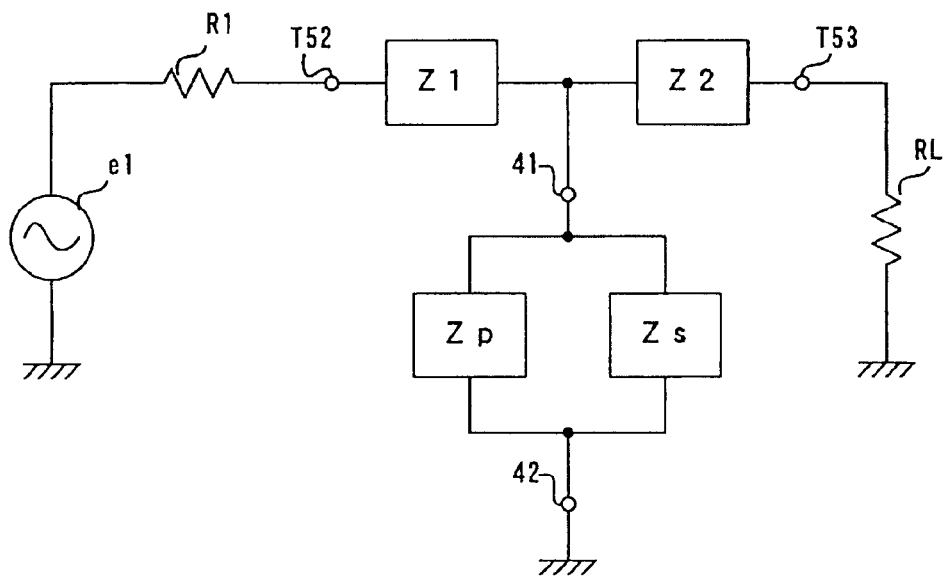
FIG. 24A is a schematic circuit diagram showing an equivalent circuit representing the equivalent circuit of FIG. 22B.

In FIG. 24A, a T-shaped circuit is connected across an AC power source e1, a resistance R1, and a load resistance RL. The T-shaped circuit includes a series circuit configured by impedances Z1 and Z2. The T-shaped circuit also includes a parallel circuit configured by impedances Zp and Zs, which parallel circuit is connected to a middle point of the series circuit. The impedance Zp corresponds to a parallel capacity part of the piezoelectric vibrator. The impedance Zs corresponds to an impedance of the series connection of L11, C11, and r11 of the piezoelectric vibrator.

Figure 24B:
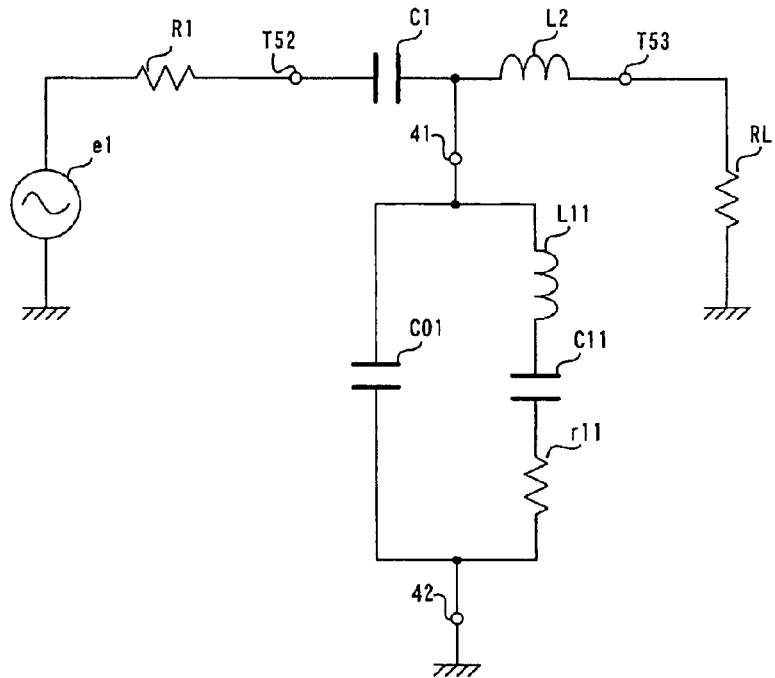
FIG. 24B is a schematic circuit diagram showing an equivalent circuit representing the third embodiment of the oscillation circuit according to the present invention for cancelling parallel capacities.

For the purpose of analyzing a performance of the circuit shown in FIG. 24 A, it is preferable that a cascade matrix element of the T-shaped circuit between intermediate taps T52 and T53 is firstly calculated, and then an admittance matrix element Y21, which is convenient to estimate the parallel capacity cancelling effect, is calculated. The following equation is obtained by performing such the calculating processes.

$$Y21 = \frac{Zs}{Z1Z2\left[1 + Zs\left(\frac{1}{Zp} + \frac{1}{Z1} + \frac{1}{Z2}\right)\right]} \quad \text{(Equation 4)}$$

Here, $$\frac{1}{Zp} + \frac{1}{Z1} + \frac{1}{Z2} = 0 \quad \text{(Equation 5)}$$

if a condition given by an equation 5 is fulfilled, the equation 4 can be simply rewritten by the following equation.

$$Y21 = \frac{Zs}{Z1Z2} \quad \text{(Equation 6)}$$

It is necessary to pay attention to the right side of the equation 6 in which the numerator has only the impedance Zs of the series connection configured by L11, C11, and r11.

The numerator of the equation 6 has only the impedance Zs. Zp is eliminated in the equation 6, which means that the impedance Zp of the parallel capacity CO1 is cancelled, and in addition, means that the admittance Y21 is proportional to the impedance Zs and the inverted impedance Zs is converted to the admittance.

Next, the equation 5 giving the condition will now be described, under which the parallel capacities are cancelled and the impedance is inverted. Since the equation 5 holds even if Z1 and Z2 are replaced with each other, the following equation is obtained by rearranging equation 5 with respect to Z2.

$$Z2 - \frac{Z1}{1 + Z1/Zp} = 0 \quad \text{(Equation 7)}$$

As described above, since the impedance Zp corresponds to the parallel capacity C01 of the piezoelectric vibrator, the impedance Zp is given by the following equation.

$$Zp = \frac{1}{j\omega C01} \quad \text{(equation 8)}$$

In addition, since the impedance Z1 is an impedance of a capacitor having the capacitance value C1, the impedance Z1 is given by the following equation.

$$Z1 = \frac{1}{j\omega C1} \quad \text{(equation 9)}$$

The following equation is obtained by substituting the equation 9 and the equation 8 for equation 7.

$$Z2 - \frac{1}{j\omega(C1 + C01)} = 0 \quad \text{(equation 10)}$$

Since the impedance Z2 of the equation 10 is an impedance of a coil having the inductance value L2, the impedance Z2 is given by the following equation.

$$Z2 = j\omega L2 \quad \text{(equation 11)}$$

The following equation is obtained by substituting equation 11 for equation 10.

$$j\omega L2 - \frac{1}{j\omega(C1 + C01)} = 0 \quad \text{(Equation 12)}$$

When the resonance angular frequency $\omega$ of the equation 12 is given by the following equation, the condition given by the equation 10, that is, the equation 5 will be completely fulfilled.

$$\omega^2 = \frac{1}{L2(C1 + C01)} = (\omega c)^2 \quad \text{(equation 13)}$$

Here, the resonance angular frequency $\omega c$ of equation 13 is referred to as a parallel capacity cancelling resonance angular frequency. Although the conditional equation 5 is completely fulfilled if the parallel capacity cancelling resonance angular frequency $\omega c$ has one value, a condition that the left side of the conditional equation 5 is approximately 0 is fulfilled even if the parallel capacity cancelling resonance angular frequency approximately $\omega c$ has the approximate value. The equation 4 is approximated by the equation 6 since the second term of the denominator of the equation 4 has a value less than 1. The correctness of the above-mentioned theoretical analysis is proven by the measurement result shown in FIG. 23.

The third embodiment of the oscillation circuit according to the present invention has been described. In the third embodiment, the impedance Z2 of equation 10 corresponds to the coil. The next embodiment where the impedance Z2 corresponds to a "negative capacity" will be described. An oscillation circuit having a negative capacity is disclosed in, for example, "Japanese Patent No. 3400165". In this case, a frequency dependence of the negative capacity is similar to a frequency dependence of the left side of the equation 5. Thus, a condition given by the equation 10 is fulfilled over a wide rage of frequency.

A fourth embodiment of the oscillation circuit according to the present invention will now be described with reference to FIG. 25. An oscillation circuit shown in FIG. 25 has two T-shapes circuits of FIG. 22A, each of which has the complex piezoelectric vibrator according to the present invention connected to a shunt arm, the capacitor, and the coil.

Figure 25:
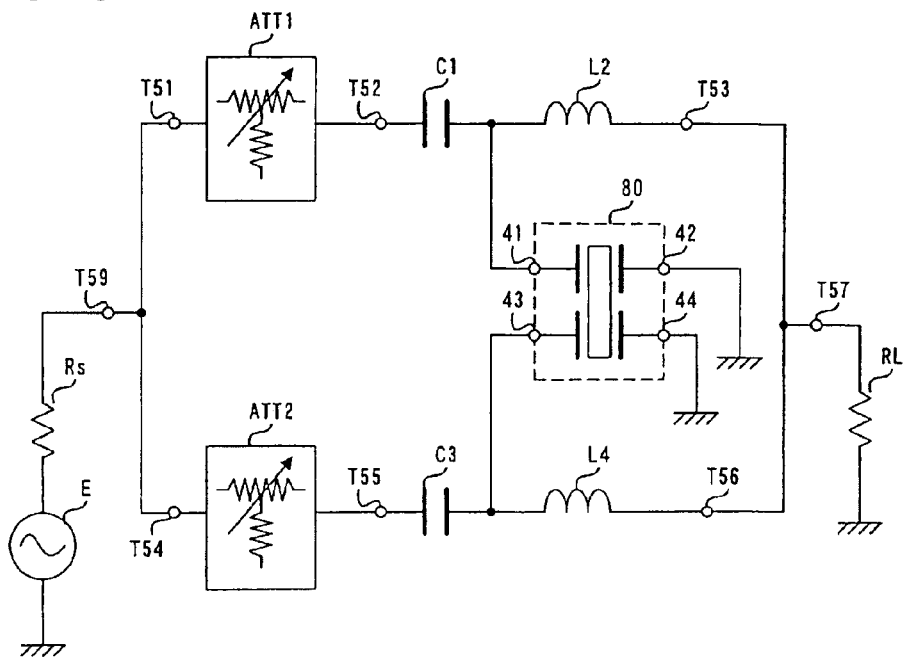
FIG. 25 is a schematic circuit diagram showing a fourth embodiment of the oscillation circuit according to the present invention.

As shown in FIG. 25, in a complex vibrator 80, two conventional piezoelectric vibrators Q1 and Q2 are connected across the external terminals 41 and 42 and across the external terminals 43 and 44, respectively. Resonance frequencies of the two piezoelectric vibrators Q1 and Q2 are 9.9952 MHz and 10.005116 MHz, respectively. Both of the piezoelectric vibrators Q1 and Q2 are formed from a HC-49/U type AT-cut quartz resonator, and its design and specification are the same as the one described above.

Each nominal capacitance value of the capacitors C1 and C2 is 2.5 pF and each nominal inductance value of the coils L2 and L4 is 27 µH.

Conditions of circuit element constants of the T-shaped circuits of FIG. 25 between intermediate taps 52 and 53 (including the quartz resonator Q1) and between intermediate taps 55 and 56 (including the quartz resonator Q2) are configured by adopting the conditions described with reference to FIG. 22B thereto.

A circuit between intermediate taps 59 and 57 shown in FIG. 25 is connected across a frequency variable type high frequency signal generator SG and a level measuring instrument L1 as shown in circuit of FIG. 3. And then, a relation between an antiresonance frequency and a difference in attenuation values between two attenuators ATT1 and ATT2 is shown in FIG. 26.

Figure 26:
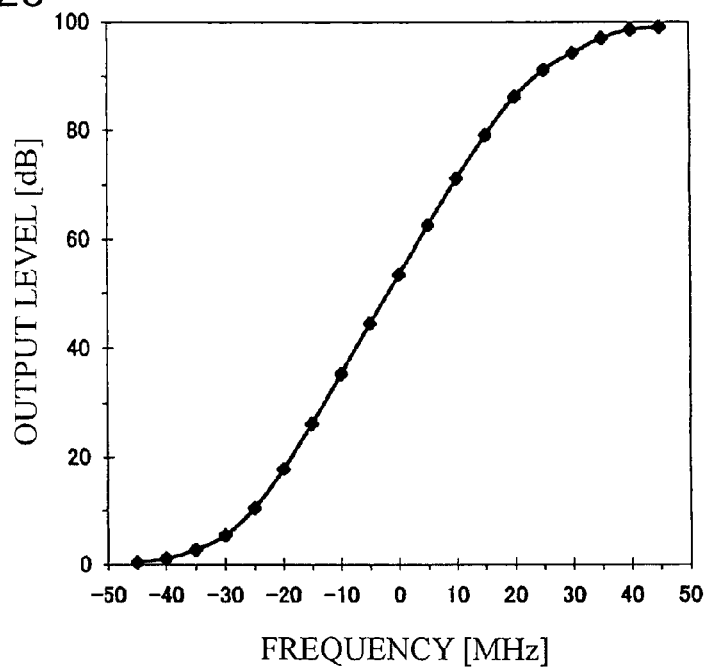
FIG. 26 is a graph showing experimental frequency characteristics for fourth embodiment of the oscillation circuit according to the present invention.

It is understood from FIG. 26 that depending on the difference of attenuation values between two attenuators, a value of an antiresonance frequency can be continuously adjusted over a wide rage up to 98.6% of a frequency difference between resonance frequencies of the two piezoelectric vibrators. An absolute value of the maximum normalized frequency varies over a wide rage up to 978 ppm.

A circuit configuration including the two circuits, each of which can cancel the parallel capacity, is characterized by a resonance sharpness (an effective Q value) which is substantially constant between the resonance frequencies of the quartz resonators Q1 and Q2.

In FIG. 25, it is experimentally clarified that the antiresonance frequency is correlated with the difference in the attenuation values between the two attenuators ATT1 and ATT2. The correlation will now be theoretically described.

In FIG. 25, the shunt arms include external terminals 41 and 42 of the piezoelectric vibrator 80. Elements A1, B1, C1, and D1 of a cascade matrix F1 is calculated by using circuit element values across the intermediate taps T52 and T53.

In the same way, in the circuit of FIG. 25, the shunt arms include external terminals 43 and 44 of the piezoelectric vibrator 80. Elements A2, B2, C2, and D2 of a cascade matrix F2 is calculated by using circuit element values across the intermediate taps T55 and T56.

Figure 27A:
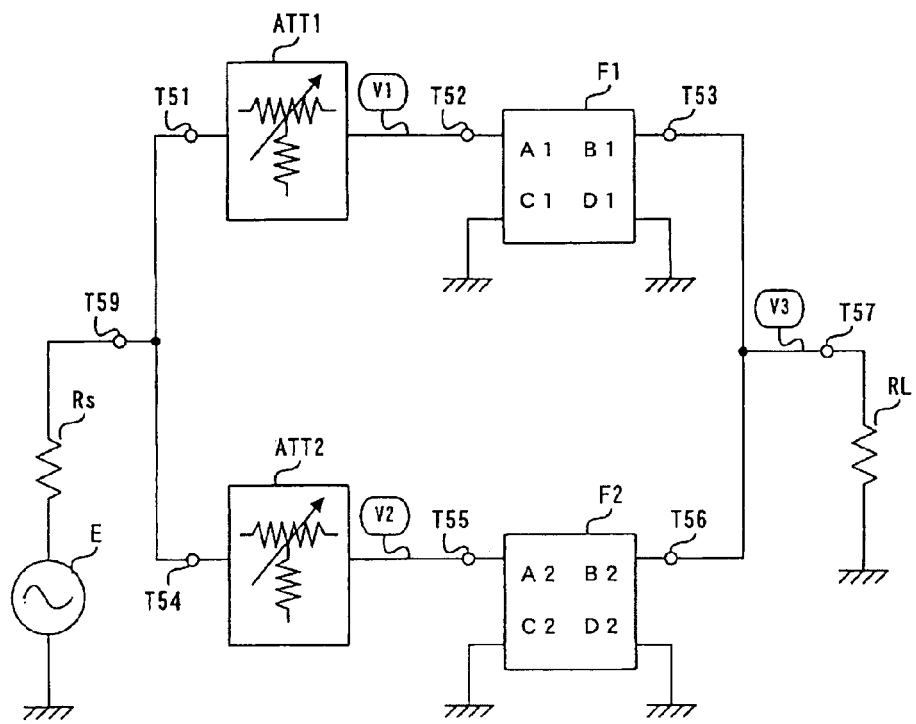
FIG. 27A is a schematic circuit diagram of an equivalent circuit representing the fourth embodiment of FIG. 25.

An analytical result is shown in an equivalent circuit of FIG. 27A. As shown in FIG. 27A, a voltage V1 corresponds to a voltage across an intermediate tap T52 and a ground. A voltage V2 corresponds to a voltage between an intermediate tap T55 and the ground. A voltage V3 corresponds to a voltage between an intermediate tap T57 and the ground. The voltages V1 and V2 can be adjusted by varying only the attenuation values of the attenuators ATT1 and ATT2.

Figure 27B:
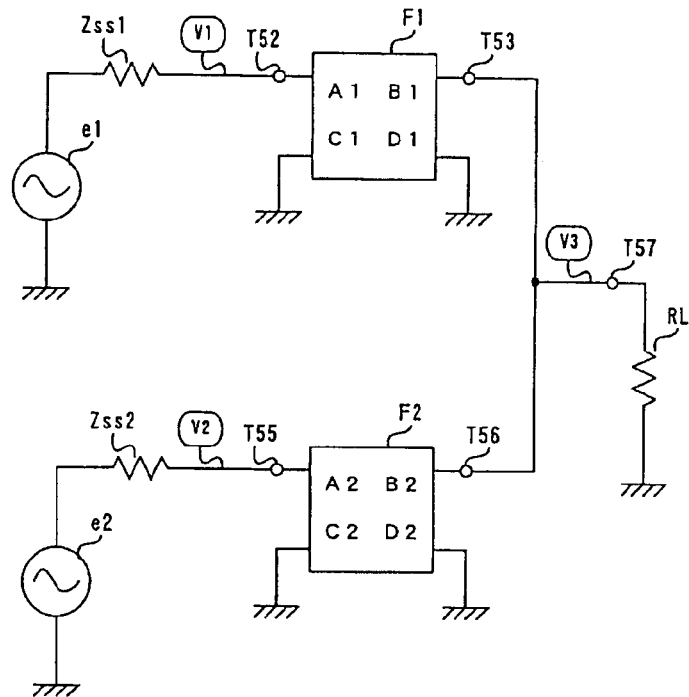
FIG. 27B is a schematic circuit diagram of an equivalent circuit representing the fourth embodiment of FIG. 25.

The equivalent circuit shown in FIG. 27A can be replaced by an equivalent circuit shown in FIG. 27B. Here, Zss1 denoted in FIG. 27B is an impedance in a direction from an intermediate tap T52 of FIG. 27A to a power supply. Zss2 is an impedance in a direction from an intermediate tap T55 of FIG. 27A to the power supply. In addition, an AC power source e1 of FIG. 27B is configured so that a voltage at the intermediate tap T52 of FIG. 27B is equal to the voltage V1 of FIG. 27A. An AC power source e2 of FIG. 27B is configured so that a voltage at the intermediate tap T55 of FIG. 27B is equal to the voltage V2 of FIG. 27A.

Figure 27C:
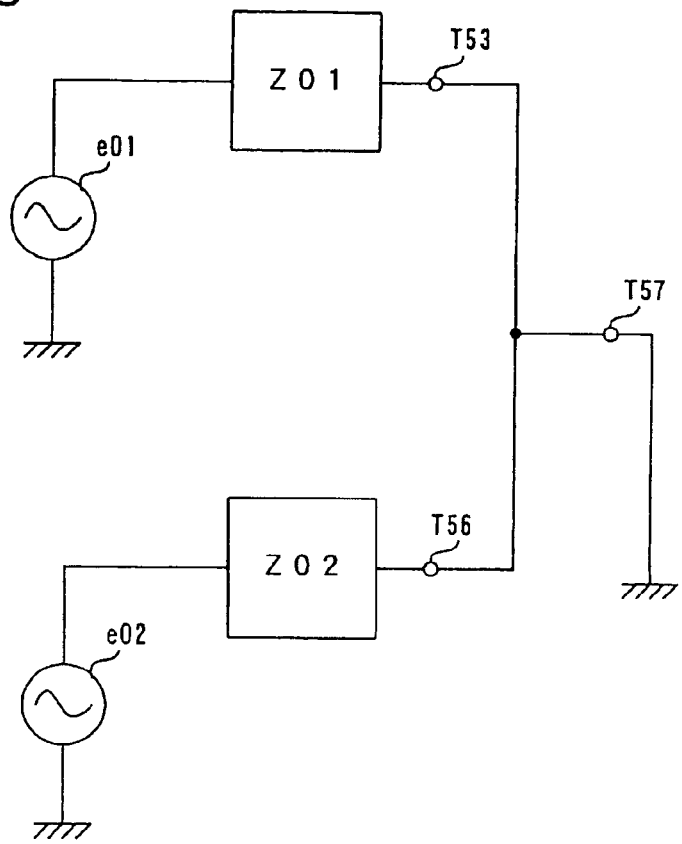
FIG. 27C a circuit diagram of an equivalent circuit representing the fourth embodiment of FIG. 25.

Cascade matrixes F1 and F2 of FIG. 27B can be replaced by Z01 and Z02, respectively as shown in FIG. 27C. The replacement is performed on the basis of Thevenin's theorem by using elements of the cascade matrixes. Here, the impedances Z01 and Z02 of FIG. 27C are given by the following equation, respectively.

$$Z01 = \frac{D1 \cdot Zss1 + B1}{C1 \cdot Zss1 + A1} \quad \text{(equation 14)}$$

$$Z02 = \frac{D2 \cdot Zss2 + B2}{C2 \cdot Zss2 + A2} \quad \text{(equation 15)}$$

In addition, power-supply voltages e01 and e02 of FIG. 27C are given by the following equation, respectively.

$$e01 = \frac{e1}{A1 + C1 \cdot Zss1} \quad \text{(equation 16)}$$

$$e02 = \frac{e2}{A2 + C2 \cdot Zss2} \quad \text{(equation 17)}$$

Here, for the sake of deriving the relation between an antiresonance frequency of the circuit of FIG. 27B and voltages V1 and V2, it may be configured that Zss1, Zss2, and RL are equal to zero. Thus, an output current intensity IL is given by the following equation under a condition that C1=C3 and L2=L4.

$$IL = \frac{C1}{L2} \cdot (V1 \cdot ZS1 + V2 \cdot ZS2) \quad \text{(equation 18)}$$

Here, V1 corresponds to a voltage across the intermediate tap T52 and the ground. V2 corresponds to a voltage across the intermediate tap T55 and the ground. ZS1 is an impedance of the series arm connected to the piezoelectric vibrator Q1. ZS2 is an impedance of the series arm connected to the piezoelectric vibrator Q2.

The equation 18 is formally similar to the equation 1. The voltage V1 and V2 are multiplied by the impedances ZS1 and ZS2 of the two series arms, respectively. C1 divided by L2 is constant whose value does not show a frequency response characteristic, which means that a preferable Q-value is obtained over the wide range of a variable frequency.

Therefore, the correlation between the voltages V1 and V2 and the antiresonance frequency in the fourth embodiment is given by the equation 3. It is understood from the experimental results of FIGS. 20 and 26 that the correlation between the voltages V1 and V2 and the antiresonance frequency is followed by the equation 3.

Therefore, the parallel capacities across the external terminals T41, T42 and between the external terminals T43, T44 can be reduced, and thus only the series arms causing the resonance frequencies are remarkably effective. That is, influences of the unnecessary parallel capacities can be reduced by using the complex resonance circuit according to the present invention. The complex resonance circuit according to the present invention (piezoelectric vibrator) utilizes a property of the piezoelectric vibrator vibrating around at a antiresonance frequency fp at which an impedance is comparatively high, so that an improvement effect of figure of merit (corresponding to a Q-value of the piezoelectric vibrator divided by the capacitance ratio) appears remarkably, and thus a generation of an oscillation power output with a high quality can be expected.

The first to forth embodiments of the oscillation circuit according to the present invention utilizing two natural vibration modes has been described. The first to forth embodiments can be modified as follows. By applying, for example, three or more voltages, three or more natural vibration modes are utilized. In this case, a similar effect will be achieved.

A fifth embodiment of the oscillation circuit which directly oscillates an antiresonance frequency will now be described with reference to FIG. 28.

A basic idea of the fifth embodiment is as follows. An oscillation circuit of the fifth embodiment includes two T-shaped circuits of FIG. 25 connected to the complex resonance circuit 80 (also referred to as "piezoelectric vibrator") of the present invention. The oscillation circuit is configured so as to maintain a loop gain thereof at which the complex resonance circuit 80 can vibrates at a sharp antiresonance frequency.

Figure 28:
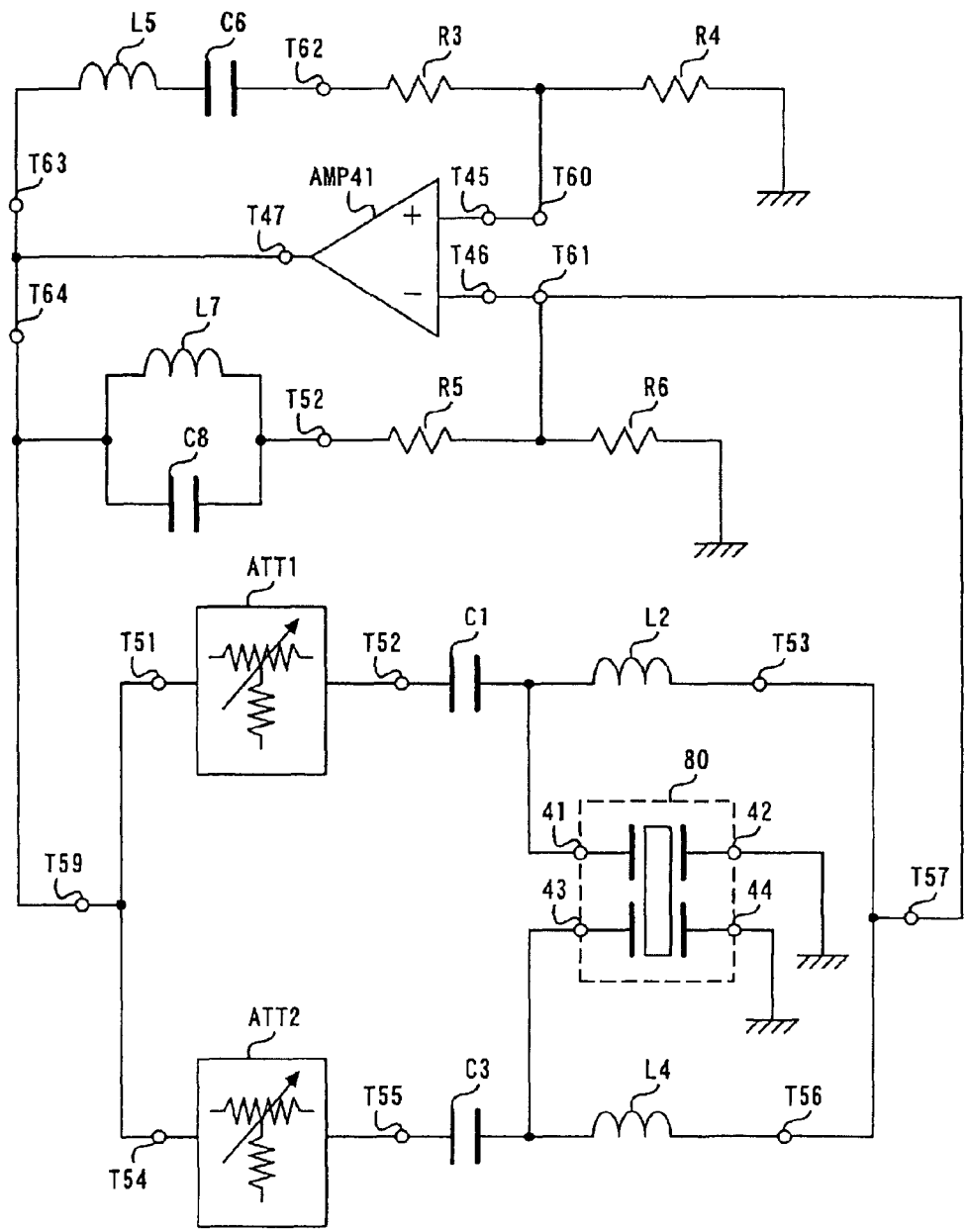
FIG. 28 is a schematic circuit diagram showing a fifth embodiment of the oscillation circuit according to the present invention.

FIG. 28 is a block diagram showing the fifth embodiment of the oscillation circuit according to the present invention. The oscillation circuit of FIG. 28 has the complex resonance circuit according to the present invention corresponding to a part enclosed by a dotted line. An amplifier AMP41 has a positive input terminal 45 (connected to an intermediate tap 60), a negative input terminal 46 (connected to an intermediate tap 61), and a positive output terminal 47 (connected to an intermediate taps 63, 64).

The fifth embodiment of the oscillation circuit according to the present invention for oscillating an antiresonance frequency is required to fulfill the following three basic conditions.

A first condition is correlated with a positive feedback loop. As shown in FIG. 28, a series connection circuit of a coil L5, a capacitor C6, and a resistance R3 is connected to the positive output terminal 47 of the amplifier AMP41 via the intermediate tap 63. The series connection circuit is also connected to the positive input terminal 45 of the amplifier AMP41 via the intermediate tap 60. A resistance R4 is connected to a middle point between the resistance R3 and an intermediate tap 60, and in addition, connected to an earth potential. A positive feedback loop is configured by a loop circuit connected from the positive output terminal 47 to the positive input terminal 45 of the amplifier AMP41. If a loop gain of the positive feedback loop is more that 1, the oscillation circuit oscillates at a predetermined frequency whose range is variable. An inductance value of the coil L5 and a capacitance value of the capacitor C6 are configured so that a series resonance frequency determined therefrom is equal to the predetermined frequency. On the other hand, the resistances R3 and R4 are used for adjusting the loop gain of the positive feedback loop.

A second condition is correlated with a negative feedback loop. As shown in FIG. 28, two T-shaped circuits are configured. One of the T-shaped circuits includes a coil L2 and a capacitor C1 connected between intermediate taps 52 and 53 and external terminals 41 and 42 of the piezoelectric vibrator 80. The other of the T-shaped circuits includes a coil L4 and a capacitor C3 connected between intermediate taps 55 and 56 and external terminals 43 and 44 of the piezoelectric vibrator 80.

Each of the two T-shaped circuits configuring a negative feedback loop shows a frequency characteristic curve as shown in FIG. 23. If the amount of a negative feedback of the T-shaped circuits is decreased only at an antiresonance frequency fp, the loop gain of the positive feedback loop will be more than 1. Thus, the oscillation circuit of FIG. 28 can oscillates at the antiresonance frequency fp.

A third condition is correlated with a stabilization of a DC bias voltage. As shown in FIG. 28, a series circuit is configured by a resistance R5 and a parallel circuit having a coil L7 and a capacitor C8. One end of the series circuit is connected to the positive output terminal 47 of the amplifier AMP41 via the intermediate tap T64. The other end of the series circuit is connected to the negative input terminal 46 of the amplifier AMP41 via an intermediate tap T61. One end of a resistance R6 is connected to a middle point between the resistance R5 and the intermediate tap T61. The other end of the resistance R6 is connected to an earth potential. An inductance value of the coil L7 and a capacitance value of the capacitor C8 are configured so that a parallel resonance frequency determined therefrom is equal to the predetermined frequency.

The negative input terminal 46 of the amplifier AMP41 is connected to the intermediate tap 61, thus a negative feedback loop is configured by a loop connecting from the positive output terminal T47 to the negative input terminal T46 via the intermediate tap T64, the series circuit having the resistance R5 and the parallel circuit having the coil L7 and the capacitor C8, and the intermediate tap T61. Since a DC current also conducts through the negative feedback loop via the coil L7 configuring the loop, the negative feedback loop has a function of stabilizing the DC bias voltage from the oscillation circuit starts to oscillate until an oscillation frequency is saturated. By changing values of the resistances R5 and R6, the DC bias voltage and a loop gain of the negative feedback loop can be mainly adjusted.

When the three conditions are fulfilled, the oscillation circuit of FIG. 28 can output a stable oscillation power of an antiresonance frequency.

A variation of the fifth embodiment of FIG. 28 will now be described.

In the variation of the fifth embodiment of FIG. 28, reactance elements across the intermediate taps 62 and 63 of FIG. 28 is replaced by at least one resistance element or at least one resistance element together with at least one reactance element.

In addition, the amplifier AMP41 may be replaced by an amplifier having only one positive input terminal and two output terminals. The positive input terminal corresponds to the positive input terminal T45 of FIG. 28. The two output terminals correspond to the positive output terminal T47 of FIG. 28 and a negative output terminal T48 (not shown). In this case, the negative input terminal T46 is disconnected from the intermediate tap T61, and then the intermediate tap T61 is connected to the intermediate tap T60. In addition, the intermediate tap T63 is disconnected from the intermediate tap T64, and then the positive output terminal T47 is connected to the intermediate tap T63. The negative output terminal T48 is connected to the intermediate tap T64. The variation of the fifth embodiment can similarly oscillate at an antiresonance frequency fp.

In the first and fifth embodiments of the oscillation circuit described above, for the purpose of controlling the voltages applied across the terminals T41 and T42 and the external terminals T43 and T44 of the piezoelectric vibrator, the attenuation values of the attenuators are adjusted while holding the power output of the amplifier constant. Even if the attenuators are replaced by output voltage controlling type amplifiers, a similar effect will be achieved. If the output voltage controlling type amplifier has a small output impedance value in comparison with the value of the two equivalent resistances of the piezoelectric vibrator (for instance, r1 and r2 of FIG. 8A), degradation of a Q-value (sharpness of the peak resonance) of an antiresonance frequency will be reduced at the time when the oscillation circuit is implemented.

Furthermore, if the differential amplifiers AMP90 and AMP91 shown in FIG. 16 has a small input impedance value in comparison with the two equivalent resistances of the piezoelectric vibrator (for instance, r1 and r2 of FIG. 8A), degradation of a Q-value of an antiresonance frequency will be reduced at the time when the oscillation circuit is implemented.

The operation amplifiers AMP90 and AMP91 of FIG. 16 utilize a bridge balance phenomenon. Even if each of the attenuators ATT41 and the ATT42 is replaced by a push-pull output type amplifier, a modified circuit has effects similar to the circuit.

As described above, the first to fifth embodiments of the oscillation circuit according to the present invention eliminating variable reactance elements such as a variable-capacitance diode can adjust a frequency. A performance of the piezoelectric vibrator of the present invention can be more improved by providing a conventional variable reactance element together.

A sixth embodiment of the oscillation circuit according to the present invention will now be described. The sixth embodiment includes the piezoelectric vibrator according to present invention and further includes conventional variable reactance elements. For instance, a capacitance value of a variable-capacity diode varies depending on a voltage applied thereto. A variable reactance element such the capacity variable diode has two terminals, and thus, operates similar to a capacitor (capacity) and a coil (inductance) having two terminals. Here, one terminal of an element having two terminals is referred as to P and the other terminal to Q.

It will now be described in reference to the circuit of FIG. 14A that an oscillation frequency of the oscillation circuit can be adjusted by changing a position of the variable reactance element. For the sake of adjusting an oscillation frequency of the oscillation circuit, one terminal P of the variable reactance element may be only connected to, for instance, either one of the external terminals 41, 42, 43, and 44 of the piezoelectric vibrator 80 of FIG. 14A. The other terminal Q of the variable reactance element is connected to any positions in the oscillation circuit of FIG. 14A excluding the terminal P of the variable reactance element. Thus, an antiresonance frequency can be adjusted. In FIG. 14A, the external terminals 41 and 42 of the piezoelectric vibrator 80 are referred as to "hot points". If the variable reactance element is positioned at a position between the point 41 and the earth potential (the earth) or between the point 42 and the earth potential, an antiresonance frequency can be adjusted with a high sensitivity.

The sixth embodiment has two means, one of which is a variable-frequency mean for utilizing the present invention and the other of which is a variable-frequency mean for utilizing the variable reactance element. For example, a radio communications system utilizes the two means for the purpose of switching a channel and for modulating a signal. The complex resonance circuit of the present invention has two series arms whose equivalent circuit constants are dependent on voltages applied thereto. By utilizing this behavior, a variable-frequency filter capable of controlling a frequency characteristic can be configured.

Figure 17A:
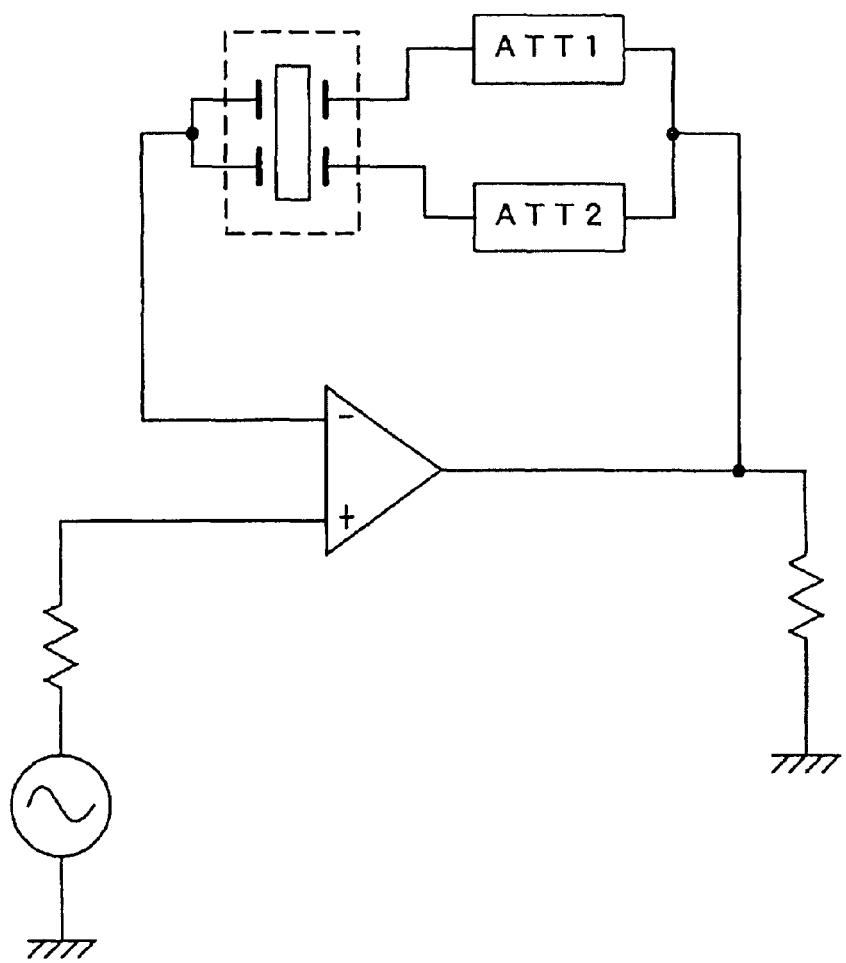
FIG. 17A is a schematic circuit diagram showing a first embodiment of a filter using the complex resonance circuit according to the present invention.
Figure 17B:
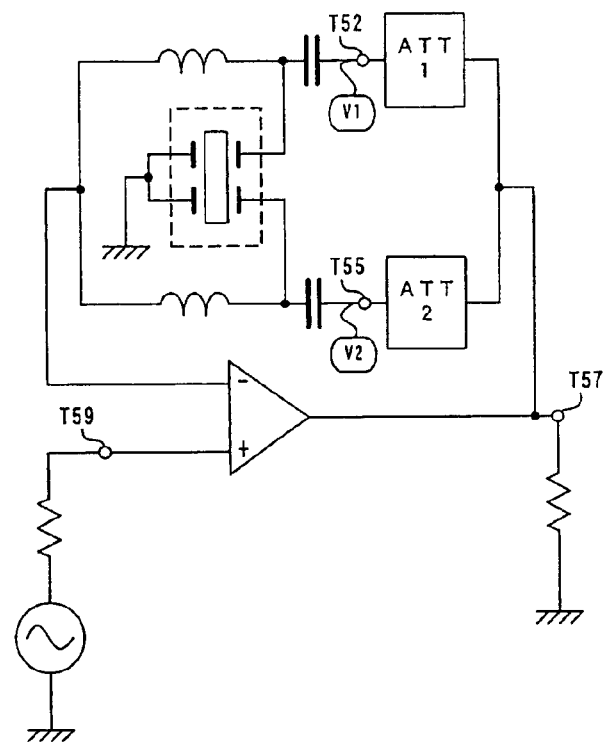
FIG. 17B is a schematic circuit diagram showing a second embodiment of a filter using the complex resonance circuit according to the present invention.

The measuring circuit shown in FIG. 3 and FIG. 25 utilizing one of the above-described complex resonators (hereafter MR) having the piezoelectric vibrator etc. according to present invention really realizes a basic band section of a band rejection filter (hereafter BRE). The oscillation circuits shown in FIGS. 14 and 28 configured by the negative feedback circuit having one MR and four capacitors include a circuit part realizing a basic band section of a band pass filter (hereafter BTE). The band path filter is shown in FIGS. 17A and 17B. These four capacitors shown in FIGS. 14 and 28 may be replaced by four coils, four resistances, or combinations of them.

Next, an embodiment of the filter according to the present invention will now be described as a band pass filter with reference to FIG. 17B. A circuit structure of FIG. 17 B is configured by connecting in parallel an inverting amplifier between the intermediate taps T59 and T57 of FIG. 25. Thus, a negative feedback loop is configured in the circuit of FIG. 17B.

The oscillation circuit of FIG. 25 shows an antiresonant characteristic as shown in FIG. 23 from the equation 18. The circuit of FIG. 25 configures a negative feedback part of the inverting amplifier, so that a negative feedback is applied on the circuit of FIG. 17 B on the basis of an antiresonant characteristic thereof. A relation between voltages at intermediate taps T59 and T57 is reversed in its magnitude in similar with the case of FIG. 15, and thus the circuit of FIG. 17 shows a band-pass characteristic.

As an example of the circuit of FIG. 17B, a filter, in which a frequency characteristic thereof can be controlled by changing voltages V1 and V2 applied thereto, will now be described. In FIG. 17A, if the voltage V1 at the intermediate tap T52 of a negative feedback part and the voltage V2 at the intermediate tap T55 are changed, an antiresonance frequency of the negative feedback part depends on a ratio of both voltages as shown in FIG. 26. A pass-band characteristic of the circuit of FIG. 17B can be controlled by the applied voltages V1 and V2.

When an operational amplifier and a NAND circuit (an inverting gate circuit) are used as the inverting amplifier, it is required that a mean for stabilization of a DC bias voltage connected to the earth potential at the intermediate taps T61 and T64 etc. is provided with, for example, the oscillation circuit having the amplifier shown in FIG. 28.

For the sake of configuring a higher-order filter, a method of cascade connections having a plurality of basic sections used in a conventional filter is used. By connecting in parallel the basic sections (MRE and MTE), an attenuation gradient can be largely increased. In FIG. 17B, attenuation values of two attenuators ATT1 and ATT2 are controlled for changing the frequency of the filter. The attenuators may be replaced by a conventional attenuators capable of electrically changing an attenuation value.

A variable-frequency band-pass filter utilizing the oscillation circuit according to the present invention has been described. Since the sharpness of the peak resonance of the piezoelectric vibrator is favorable, it is expected that an ideal filter will be realized by changing a narrowband band-pass filter.

What is claimed is:

1. A complex resonance circuit having an antiresonance characteristic variable with an electric power which is supplied across an input terminal and an output terminal, comprising:
    at least two resonant elements respectively having resonance frequencies different from each other; and
    an electric power supply circuit for dividing said electric power into two parts so as to respectively supply them to said resonant elements at a continuously varying distribution ratio, wherein
    said electric power supply circuit includes electric current paths, each having one end connected to a reference electric potential and including each of said resonant elements, and
    said electric power supply circuit respectively supplies said two parts to the other ends of said electric current paths and relays both of variations in electrical potentials at the other ends of said electric current paths to said output terminal.

2. A complex resonance circuit according to claim 1, wherein
    said electric power supply circuit includes two electric power supplying paths respectively connected to said two resonant elements and two variable attenuators or two variable gain amplifiers which are respectively positioned within said two electric power supplying paths, and
    each of said two electric power supplying paths includes a first electric current branch path connected from said input terminal to said output terminal and a second electric current branch path including said resonance element between a midpoint of said first electric current branch path and said reference electric potential.

3. A complex resonance circuit according to claim 2, wherein
    each of said first electric current branch paths includes an inductance element and a capacitance element which are connected in series to each other via said midpoint.

4. A complex resonance circuit according to claim 3, further comprising:
    shield means for electrostatically shielding said inductance element, said capacitance element, and said two resonant elements.

5. A complex resonance circuit according to claim 1, wherein
    each of said two resonant elements comprises a piezoelectric vibration device, a dielectric resonance device, or a resonance circuit including an inductance element and a capacitance element.

6. A complex resonance circuit according to claim 1, wherein
    said two resonant elements are formed on separate substrates.

7. A complex resonance circuit according to claim 1, wherein
    said two resonant elements are formed on the same substrate.

8. A complex resonance circuit according to claim 1, wherein
    said reference electric potential comprises an earth potential.

9. A complex resonance circuit according to claim 7, wherein each of said two resonant elements is a piezoelectric vibration device, said piezoelectric vibration devices include at least three electrode pairs formed on said substrate and two external connection terminal pairs, each pair of which are connected to said electric power supply circuit, and said three electrode pairs are connected to said two external connection terminal pairs so that two different vibration modes individually appear at said two external connection terminal pairs.

10. A complex resonance circuit according to claim 7, wherein each of said two resonant elements comprises a piezoelectric vibration device, said piezoelectric vibration devices includes at least four electrode pairs formed on said substrate and two external connection terminal pairs connected to said two electric power supplying paths, and said four electrode pairs are connected to said two external connection terminal pairs so that only two different vibration modes individually appear at said two external connection terminal pairs and a vibration mode excluding said two different vibration modes does not appear at said two external connection terminal pairs.

11. A complex resonance circuit according to claim 9, wherein said at least three electrode pairs are rear and front surface electrode pairs, both rear and front surface electrodes being opposite to each other so as to sandwich said substrate.

12. A complex resonance circuit according to claim 11, wherein said two external connection terminal pairs comprise two negative and positive external electrode pairs, one pair of said rear and front surface electrode pairs are connected to one pair of said two negative and positive external electrode pairs, and each pair of the remaining two pairs of said rear and front surface electrode pairs are connected to the other of said two negative and positive external electrode pairs.

13. A complex resonance circuit according to claim 9, wherein said substrate includes a plurality of principal surfaces, and each of said at least three electrode pairs is formed substantially in parallel on the same principal surface of said substrate.

14. A complex resonance circuit according to claim 9, wherein each of said at least three electrode pairs is configured by at least one interdigital electrode pair.

15. An oscillation circuit comprising:

an amplifier; and a feedback part for forming a feedback path connected from an output end of said amplifier to an input end of said amplifier, wherein said feedback part has a positive feedback path connected from said output end to said input end and a negative feedback path connected from said output end to said input end, said negative feedback path which is independent of said positive feedback path has at least two resonant elements respectively having different resonance frequencies and an electric power supply circuit for dividing an electric power supplied from said input end into two parts so as to respectively supply them to said resonant elements at a continuously varying division ratio, said electric power supply circuit includes two electric power supplying paths respectively connected to said two resonant elements and two variable attenuators or two variable gain amplifiers which are respectively positioned within said two electric power supplying paths, and each of said two electric power supplying paths includes a first electric current branch path connected from an output end of said amplifier to an input end and a second electric current branch path including said resonant element between a midpoint of said first electric current branch path and an earth potential.

16. An oscillation circuit according to claim 15, wherein said first electric current branch path includes an inductance element and a capacitance element which are connected in series to each other via said midpoint.

17. An oscillation circuit according to claim 16 further comprising shield means for electrostatically shielding said inductance element, said capacitance element, and said two resonant elements.

18. An oscillation circuit according to claim 15, wherein said first electric current branch path includes an inductance element and a capacitance element which are connected in series to each other via said midpoint and an antiresonance frequency appears between resonance frequencies of said two resonant elements, said antiresonance frequency being derived from both of a combination capacity of a capacity of said capacitance element of said first electric current branch path and a parallel capacity of said resonant elements and an inductance of said inductance element of said first electric currant branch path.

19. An oscillation circuit according to claim 15, wherein said positive feedback path has a frequency characteristic and a resonance frequency of said positive feedback path appears between the highest and the lowest resonance frequencies of said two resonant elements.

20. An oscillation circuit according to claim 15, wherein each of said two resonant elements is a piezoelectric vibration device, a dielectric resonance device, or a resonance circuit including an inductance element and a capacitance element.

21. An oscillation circuit according to claim 15, wherein said two resonant elements are formed on separate substrates.

22. An oscillation circuit according to claim 15, wherein said two resonant elements are formed on the same substrate.

23. An oscillation circuit according to claim 15, wherein each of said two resonant elements is a piezoelectric vibration device, said piezoelectric vibration device includes at least three electrode pairs formed on said substrate and two external connection terminal pairs respectively connected to said two electric power supplying paths, and said three electrode pairs are connected to said two external connection terminal pairs so that two different vibration modes individually appear at said two external connection terminal pairs.

24. An oscillation circuit according to claim 15, wherein each of said two resonant elements is a piezoelectric vibration device, said piezoelectric vibration device includes at least four electrode pairs formed on said substrate and two external connection terminal pairs respectively connected to said two electric power supplying paths, and said four electrode pairs are connected to said two external connection terminal pairs so that only two different vibration modes individually appear at said two external connection terminal pairs and a vibration mode excluding said two different vibration modes does not appear at said two external connection terminal pairs.

25. An oscillation circuit according to claim 23, wherein said at least three electrode pairs are rear and front surface electrode pairs, both rear and front surface electrodes being opposite to each other so as to sandwich said substrate.

26. An oscillation circuit according to claim 25, wherein said two external connection terminal pairs comprise two negative and positive external electrode pairs, one pair of said rear and front surface electrode pairs are connected to one pair of said two negative and positive external electrode pairs, and each pair of the remaining two pairs of said rear and front surface electrode pairs are connected to the other pair of said two negative and positive external electrode pairs.

27. An oscillation circuit according to claim 23, wherein said substrate includes a plurality of principal surfaces, and each of said at least three electrode pairs is formed substantially in parallel on the same principal surface of said substrate.

28. An oscillation circuit according to claim 23, wherein each of said at least three electrode pairs is configured by at least one interdigital electrode pair.

* * * * *